US012603123B2

(12) United States Patent
Simsek-Ege et al.

(10) Patent No.: US 12,603,123 B2
(45) Date of Patent: Apr. 14, 2026

(54) MICROELECTRONIC DEVICES INCLUDING A CONTROL CIRCUITRY STRUCTURE BONDED TO A MEMORY ARRAY STRUCTURE

(71) Applicant: Micron Technology, Inc., Boise, ID (US)

(72) Inventors: Fatma Arzum Simsek-Ege, Boise, ID (US); Beau D. Barry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 18/409,714

(22) Filed: Jan. 10, 2024

(65) Prior Publication Data

US 2024/0290374 A1      Aug. 29, 2024

Related U.S. Application Data

(60) Provisional application No. 63/486,756, filed on Feb. 24, 2023.

(51) Int. Cl.
*G11C 8/08* (2006.01)
*G11C 11/408* (2006.01)
(Continued)

(52) U.S. Cl.
CPC ...... *G11C 11/4091* (2013.01); *G11C 11/4085* (2013.01); *G11C 11/4087* (2013.01); *G11C 11/4097* (2013.01)

(58) Field of Classification Search
CPC ............ G11C 11/4091; G11C 11/4085; G11C 11/4087; G11C 11/4097
See application file for complete search history.

(56) References Cited

U.S. PATENT DOCUMENTS

| | | | | |
|---|---|---|---|---|
| 10,790,286 B2 * | 9/2020 | Juengling | ............. | G11C 11/405 |
| 11,751,383 B2 * | 9/2023 | Simsek-Ege | ........... | H10B 12/50 |
| | | | | 365/63 |

(Continued)

OTHER PUBLICATIONS

He et al., "Microelectronic Devices Including Control Logic Circuitry Overlying Memory Arrays, and Related Memory Devices and Electronic Systems", Filed Aug. 29, 2022, U.S. Appl. No. 17/898,150, 47 pages.

(Continued)

*Primary Examiner* — Mushfique Siddique
(74) *Attorney, Agent, or Firm* — TraskBritt

(57) ABSTRACT

A microelectronic device includes a memory array structure and a control circuitry structure overlying and bonded to the memory array structure. The memory array structure includes memory cells, digit lines, and word lines. The control circuitry structure includes a control circuitry region, digit line contact sections, and word line contact sections. The control circuitry region includes sense amplifier sections including sense amplifiers, and sub-word line driver sections including sub-word line drivers. The digit line contact sections are horizontally adjacent to the sense amplifier sections in a first direction and include contact structures coupled to the sense amplifiers and the digit lines. The word line contact sections are horizontally adjacent to the sub-word line driver sections in a second direction orthogonal to the first direction and include additional contact structures coupled to the sub-word line drivers and the word lines. Additional microelectronic devices, memory devices, and electronic systems are also described.

17 Claims, 7 Drawing Sheets

(51) Int. Cl.
    *G11C 11/4091* (2006.01)
    *G11C 11/4097* (2006.01)

(56) References Cited

U.S. PATENT DOCUMENTS

| | | | | |
|---|---|---|---|---|
| 11,776,925 B2 * | 10/2023 | Simsek-Ege | ........ | G11C 11/4085 |
| | | | | 257/296 |
| 11,785,764 B2 | 10/2023 | Simsek-Ege et al. | | |
| 11,837,594 B2 * | 12/2023 | Simsek-Ege | ......... | H10B 12/036 |
| 11,842,990 B2 * | 12/2023 | Simsek-Ege | ........... | H10B 12/33 |
| 12,262,532 B2 * | 3/2025 | Simsek-Ege | ......... | H10B 12/485 |
| 2021/0066272 A1 * | 3/2021 | Fujisawa | ............. | G11C 11/4097 |
| 2023/0005854 A1 * | 1/2023 | Simsek-Ege | ............ | H01L 24/08 |
| 2023/0005932 A1 * | 1/2023 | Simsek-Ege | ........... | H10B 12/34 |
| 2023/0005933 A1 * | 1/2023 | Simsek-Ege | ........ | H01L 21/2007 |
| 2023/0301053 A1 * | 9/2023 | He | ........................ | H10B 12/50 |
| | | | | 257/296 |
| 2024/0040775 A1 * | 2/2024 | Simsek-Ege | ............ | H01L 24/83 |
| 2024/0290375 A1 * | 8/2024 | Simsek-Ege | ........... | G11C 5/025 |

OTHER PUBLICATIONS

He et al., "Fin Field Effect Transistor Sense Amplifier Circuitry and Related Apparatuses and Computing Systems", Filed Sep. 29, 2022, U.S. Appl. No. 17/936,760, 41 pages.

Simsek-Ege et al., "Microelectronic Devices and Memory Devices", Filed Dec. 21, 2023, U.S. Appl. No. 18/393,416, 89 pages.

Simsek-Ege, "Methods of Forming Microelectronic Devices, and Related Microelectronic Devices and Electronic Systems", Filed Sep. 7, 2022, U.S. Appl. No. 17/930,388, 77 pages.

Wieduwilt et al., "Global col. Repair With Local Column Decoder Circuitry, and Related Apparatuses, Methods, and Computing Systems", Filed Oct. 4, 2022, U.S. Appl. No. 17/937,924, 24 pages.

* cited by examiner

MICROELECTRONIC DEVICES INCLUDING A CONTROL CIRCUITRY STRUCTURE BONDED TO A MEMORY ARRAY STRUCTURE

CROSS-REFERENCE TO RELATED APPLICATION

This application claims the benefit under 35 U.S.C. § 119 (e) of U.S. Provisional Patent Application Ser. No. 63/486, 756, filed Feb. 24, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including a control circuitry structure overlying a memory array structure, and to related memory devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random-access memory (DRAM) device. A DRAM device may include a memory array including DRAM cells arranged rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF SUMMARY

In accordance with embodiments of the disclosure, a microelectronic device includes a memory array structure and control circuitry structure vertically overlying and bonded to the memory array structure. The memory array structure includes memory cells, digit lines, and word lines. The control circuitry structure includes a control circuitry region, digit line contact sections, and word line contact sections. The control circuitry region includes sense amplifier sections and sub-word line driver sections. The sense amplifier sections are proximate first diagonally opposing corners of the control circuitry region and include sense amplifiers. The sub-word line driver sections are proximate second diagonally opposing corners of the control circuitry region and include sub-word line drivers. The digit line contact sections are horizontally adjacent to the sense amplifier sections in a first direction and include contact structures coupled to the sense amplifiers and the digit lines of the memory array structure. The word line contact sections are horizontally adjacent to the sub-word line driver sections in a second direction orthogonal to the first direction and include additional contact structures coupled to the sub-word line drivers and the word lines of the memory array structure.

In accordance with additional embodiments of the disclosure, a microelectronic device includes a memory array structure and a control circuitry structure vertically overlying and bonded to the memory array structure. The memory array structure includes array regions, digit line exit regions, and word line exit regions. The array regions include memory cells, digit lines, and word lines. The digit line exit regions alternate with the array regions in a first direction and include horizontal ends of the digit lines within horizontal areas thereof. The word line exit regions alternate with the array regions in a second direction and include horizontal ends of the word lines within horizontal areas thereof. The control circuitry structure includes control circuitry regions, digit line contact sections, word line contact sections, sense amplifier sections, and sub-word line driver sections. The control circuitry regions horizontally overlap the array regions of the memory array structure. The digit line contact sections horizontally overlap the digit line exit regions of the memory array structure. The word line contact sections horizontally overlap the word line exit regions of the memory array structure. The sense amplifier sections respectively horizontally overlap two of the control circuitry regions neighboring one another in the first direction. The sub-word line driver sections respectively horizontally overlap two other of the control circuitry regions neighboring one another in the second direction.

In accordance with further embodiments of the disclosure, a microelectronic device includes a memory array structure and a control circuitry structure vertically overlying and bonded to the memory array structure. The memory array structure includes array regions respectively comprising memory cells, digit lines, and word lines within horizontal areas thereof. The control circuitry structure includes control circuitry regions, sense amplifier sections including sense amplifier circuitry, and sub-word line driver sections including sub-word line driver circuitry. The control circuitry regions horizontally overlap the array regions of the memory array structure. The sense amplifier sections respectively horizontally overlap a corner portion of each of four of the control circuitry regions horizontally neighboring one another in a first direction and in a second direction orthogonal to the first direction. The sub-word line driver sections are horizontally offset from sense amplifier sections and respectively horizontally overlap a corner portion of each of an additional four of the control circuitry regions horizontally neighboring one another in the first direction and in the second direction.

DETAILED DESCRIPTION

Figure 1:
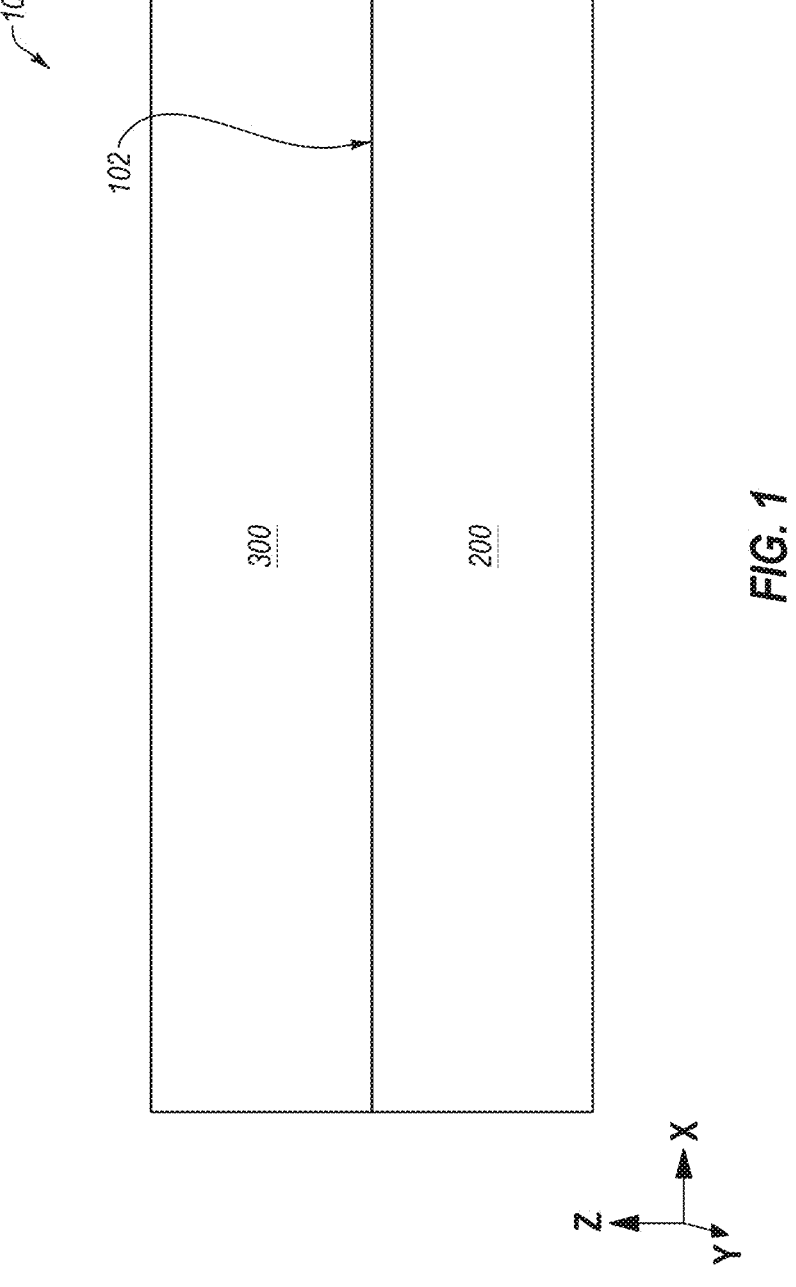
FIG. 1 is a simplified, partial longitudinal cross-sectional view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

FIG. 1 is a simplified, partial longitudinal cross-sectional view of a microelectronic device 100 (e.g., a memory device, such as a DRAM device), in accordance with some embodiments of the disclosure. The microelectronic device 100 may include a memory array structure 200 (e.g., a memory array wafer), and a control circuitry structure 300 (e.g., a control circuitry wafer) vertically overlying and attached to the memory array structure 200. The memory array structure 200 may include one or more array(s) of memory cells (e.g., volatile memory cells, such as DRAM cells). At least a majority (e.g., substantially all) of the memory cells of the microelectronic device 100 may be located within the memory array structure 200 (and, hence, outside of the control circuitry structure 300). The control circuitry structure 300 may include control logic devices formed of and including complementary metal-oxide-semiconductor (CMOS) circuitry. At least a majority (e.g., substantially all) of the CMOS circuitry (and, hence, the control logic devices) of the microelectronic device 100 may be located within the control circuitry structure 300 (and, hence, outside of the memory array structure 200). In addition, at least some of the CMOS circuitry may be positioned vertically above within horizontal areas of the array(s) of memory cells. Accordingly, the microelectronic device 100 may be considered to have a so-called "CMOS above array (CaA)" configuration.

In some embodiments, the control circuitry structure 300 is formed, at least in part, separate from the memory array structure 200; and then the control circuitry structure 300 is attached (e.g., bonded) to the memory array structure 200 at an interface 102 using oxide-oxide bonding or a combination of oxide-oxide bonding and metal-metal bonding. For example, following the separate formations of the memory array structure 200 and the control circuitry structure 300, the control circuitry structure 300 and the memory array structure 200 may be brought into physical contact with one another at the interface 102, and then the resulting assembly may be exposed to a temperature greater than or equal to about 400° C. (e.g., within a range of from about 400° C. to about 800° C., greater than about 800° C.) to form oxide-to-oxide bonds between oxide dielectric material (e.g., $SiO_x$, such as $SiO_2$) of the memory array structure 200 and additional oxide dielectric material (e.g., additional $SiO_x$, such as additional $SiO_2$) of the control circuitry structure 300. In some embodiments, the oxide dielectric material of the memory array structure 200 and the additional oxide dielectric material of the control circuitry structure 300 are exposed to at least one temperature greater than about 800° C. to form oxide-to-oxide bonds between the oxide dielectric material of the memory array structure 200 and the additional oxide dielectric material of the control circuitry structure 300.

Figure 2:
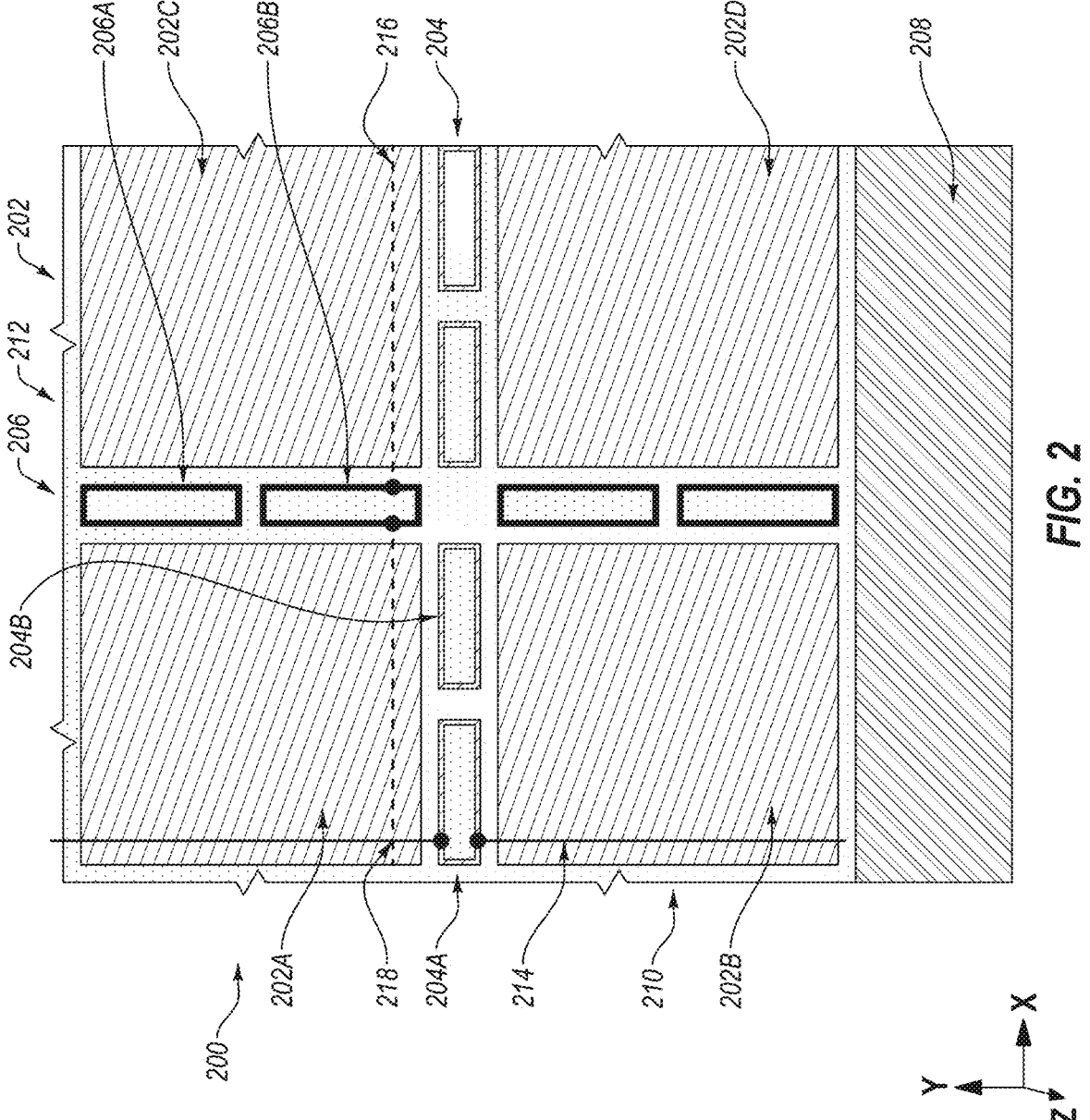
FIG. 2 is a simplified, schematic view of a memory array structure for the microelectronic device depicted in FIG. 1, in accordance with some embodiments of the disclosure.

FIG. 2 is a simplified, schematic view of a portion of the memory array structure 200 of the microelectronic device 100 (FIG. 1), in accordance with some embodiments of the disclosure. FIG. 2 shows an arrangement of various circuitry of the memory array structure 200.

As shown in FIG. 2, the memory array structure 200 may include array regions 202, digit line exit regions 204 (also referred to as "digit line contact socket regions") interposed between pairs of the array regions 202 horizontally neighboring one another in the Y-direction, word line exit regions 206 (also referred to as "word line contact socket regions") interposed between additional pairs of the array regions 202 horizontally neighboring one another in the X-direction orthogonal to the Y-direction, and one or more socket regions 208 (also referred to as "back end of line (BEOL) contact socket regions") horizontally neighboring some of the array regions 202 in one or more of the first horizontal direction and the second horizontal direction. The array regions 202, the digit line exit regions 204, the word line exit regions 206, and the socket regions 208 of the memory array structure 200 are each described in further detail below.

The array regions 202 of the memory array structure 200 may comprise regions of the memory array structure 200 having arrays of memory cells (e.g., arrays of DRAM cells) within horizontal area thereof. The memory array structure 200 may be formed to include a desired quantity of the array regions 202. For clarity and ease of understanding of the drawings and related description, FIG. 2 depicts the memory array structure 200 as including four (4) array regions 202: a first array region 202A, a second array region 202B, a third array region 202C, and a fourth array region 202D. As shown in FIG. 2, the second array region 202B may horizontally neighbor the first array region 202A in the Y-direction, and may horizontally neighbor the fourth array region 202D in the X-direction; the third array region 202C may horizontally neighbor the first array region 202A in the X-direction, and may horizontally neighbor the fourth array region 202D in the Y-direction; and the fourth array region 202D may horizontally neighbor the third array region 202C in the Y-direction, and may horizontally neighbor the second array region 202B in the X-direction. However, the memory array structure 200 may include a different quantity of array regions 202. For example, the memory array structure 200 may be formed to include greater than four (4) array regions 202, such as greater than or equal to eight (8) array regions 202, greater than or equal to sixteen (16) array regions 202, greater than or equal to thirty-two (32) array regions 202, greater than or equal to sixty-four (64) array regions 202, greater than or equal to one hundred twenty-eight (128) array regions 202, greater than or equal to two hundred fifty-six (256) array regions 202, greater than or equal to five hundred twelve (512) array regions 202, or greater than or equal to one thousand twenty-four (1024) array regions 202.

In addition, the memory array structure 200 may include a desired distribution of the array regions 202. As shown in FIG. 2, in some embodiments, the memory array structure 200 includes rows 210 of the array regions 202 extending in the X-direction, and columns 212 of the array regions 202 extending in the Y-direction. The rows 210 of the array regions 202 may, for example, include a first row including the first array region 202A and the third array region 202C, and a second row including the second array region 202B and the fourth array region 202D. The columns 212 of the array regions 202 may, for example, include a first column including the first array region 202A and the second array region 202B, and a second column including the third array region 202C and the fourth array region 202D.

Each of the array regions 202 of the memory array structure 200 may include digit lines 214 (e.g., bit lines, data lines) extending the Y-direction, word lines 216 (e.g., access lines) extending in the X-direction, and memory cells 218 arranged at intersections of the digit lines 214 and the word lines 216. Rows of the memory cells 218 may be coupled to the word lines 216, and columns of the memory cells 218 may be coupled to the digit lines 214. The memory cells 218 within an individual array region 202 may, for example, comprise DRAM cells, resistive random-access memory (RRAM) cells, conductive bridge random-access memory (conductive bridge RAM) cells, magnetic random-access memory (MRAM) cells, phase change material (PCM) memory cells, phase change random-access memory (PCRAM) cells, spin-torque-transfer random-access memory (STTRAM) cells, oxygen vacancy-based memory cells, programmable conductor memory cells, or other types of memory cells. In some embodiments, the memory cells 218 within an individual array region 202 of the memory array structure 200 are DRAM cells.

The digit lines 214 may exhibit horizontally elongate shapes extending in parallel in the Y-direction; and the word lines 216 may exhibit horizontally elongate shapes extending in parallel in the X-direction. As used herein, the term "parallel" means substantially parallel. The digit lines 214 and the word lines 216 may each individually be formed of and include conductive material. In some embodiments, the digit lines 214 and the word lines 216 are each individually formed of and include one or more of W, Ru, Mo, and titanium nitride (TiNy). Each of the digit lines 214 and each of the word lines 216 may individually be substantially homogeneous, or one or more of the digit lines 214 and/or one or more of the word lines 216 may individually be substantially heterogeneous. In some embodiments, each of the digit lines 214 and each of the word lines 216 are formed to be substantially homogeneous.

With continued reference to FIG. 2, the digit line exit regions 204 of the memory array structure 200 may comprise horizontal areas of the memory array structure 200 configured and positioned to have at least some of the digit lines 214 horizontally terminate therein. For an individual digit line exit region 204, at least some digit lines 214 operatively associated with the array regions 202 flanking (e.g., at opposing boundaries in the Y-direction) the digit line exit region 204 may have ends within the horizontal boundaries of the digit line exit region 204. In addition, the digit line exit regions 204 may also be configured and positioned to include contact structures and routing structures with the horizontal boundaries thereof that are operatively associated with at least some of the digit lines 214. As described in further detail below, some of the contact structures within the digit line exit regions 204 may couple the digit lines 214 to control logic circuitry of control logic devices (e.g., sense amplifier (SA) devices, additional devices) within the control circuitry structure 300 (FIG. 1) of the microelectronic device 100 (FIG. 1). As shown in FIG. 2, in some embodiments, the digit line exit regions 204 horizontally extend in the X-direction and are horizontally interposed between horizontally neighboring rows 210 of the array regions 202 in the Y-direction. The digit line exit regions 204 may, for example, horizontally alternate with the rows 210 of the array regions 202 in the Y-direction.

An individual digit line exit region 204 may be divided into multiple subregions. For example, as shown in FIG. 2, an individual digit line exit region 204 may include first digit line exit subregions 204A and second digit line exit subregions 204B. In some embodiments, the first digit line exit subregions 204A horizontally alternate with the second digit line exit subregions 204B in the X-direction. A pair (e.g., two (2)) of horizontally neighboring array regions 202 within an individual column 212 of the array regions 202 may include one (1) of the first digit line exit subregions 204A and one (1) of the second digit line exit subregions 204B positioned horizontally therebetween in the Y-direction. By way of non-limiting example, the first array region 202A and the second array region 202B of a first of the columns 212 of the array regions 202 may include one (1) of the first digit line exit subregions 204A and one (1) of the second digit line exit subregions 204B positioned therebetween in the Y-direction. The one (1) of the first digit line exit subregions 204A and the one (1) of the second digit line exit subregions 204B may be at least partially (e.g., substantially) confined with horizontal boundaries in the X-direction of the first array region 202A and the second array region 202B.

As described in further detail below, an individual first digit line exit subregion 204A may be configured and positioned to facilitate electrical connections between a group of the digit lines 214 (e.g., odd digit lines, even digit lines) within the memory array structure 200 and a group of control logic devices (e.g., odd sense amplifier (SA) devices, even SA devices) within the control circuitry structure 300 (FIG. 1). The group of control logic devices may be operatively associated with a portion (e.g., a half portion in the X-direction) of one (1) array region 202 (e.g., the first array region 202A) of a pair of horizontally neighboring array regions 202. The first digit line exit subregion 204A may also facilitate electrical connections between an additional group of the digit lines 214 (e.g., additional odd digit lines, additional even digit lines) and an additional group of control logic devices (e.g., additional odd SA devices, additional even SA devices) within the control circuitry structure 300 (FIG. 1). The additional group of control logic devices may be operatively associated with a corresponding portion (e.g., a corresponding half portion in the X-direction) of an additional array region 202 (e.g., the second array region 202B) of the pair of horizontally neighboring array regions 202. In addition, as also described in further detail below, an individual second digit line exit subregion 204B may be configured and positioned to facilitate electrical connections between a further group of the digit lines 214 and a further group of control logic devices of the control circuitry structure 300 (FIG. 1) operatively associated with another portion (e.g., another half portion in the X-direction) of the one (1) array region 202 (e.g., the first array region 202A), and to also facilitate electrical connections between a yet further group of the digit lines 214 and a yet further group of control logic devices of the control circuitry structure 300 (FIG. 1) operatively associated with a corresponding another portion (e.g., a corresponding another half portion in the X-direction) of the additional array region 202 (e.g., the second array region 202B).

Still referring to FIG. 2, the word line exit regions 206 of the memory array structure 200 may comprise horizontal areas of the memory array structure 200 configured and positioned to have at least some of the word lines 216 horizontally terminate therein. For an individual word line exit region 206, at least some word lines 216 operatively associated with the array regions 202 flanking (e.g., at opposing boundaries in the X-direction) the word line exit region 206 may have ends within the horizontal boundaries of the word line exit region 206. In addition, the word line exit regions 206 may also be configured and positioned to include contact structures and routing structures within the horizontal boundaries thereof that are operatively associated with the word lines 216. As described in further detail below, some of the contact structures within the word line exit regions 206 may couple the word lines 216 to control logic circuitry of additional control logic devices (e.g., sub-word line driver (SWD) devices, additional devices) within the control circuitry structure 300 (FIG. 1) of the microelectronic device 100 (FIG. 1). As shown in FIG. 2, in some embodiments, the word line exit regions 206 horizontally extend in the Y-direction and are horizontally interposed between horizontally neighboring columns 212 of the array regions 202 in the X-direction. The word line exit regions 206 may, for example, horizontally alternate with the columns 212 of the array regions 202 in the X-direction.

An individual word line exit region 206 may be divided into multiple subregions. For example, as shown in FIG. 1, an individual word line exit region 206 may include first word line exit subregions 206A and second word line exit subregions 206B. In some embodiments, the first word line exit subregions 206A horizontally alternate with the second word line exit subregions 206B in the Y-direction. A pair (e.g., two (2)) of horizontally neighboring array regions 202 within an individual row of the array regions 202 may include one (1) of the first word line exit subregions 206A and one (1) of the second word line exit subregions 206B positioned horizontally therebetween in the X-direction. By way of non-limiting example, the first array region 202A and the third array region 202C of a first row of the array regions 202 may include one (1) of the first word line exit subregions 206A and one (1) of the second word line exit subregions 206B positioned therebetween in the X-direction. The one (1) of the first word line exit subregions 206A and the one (1) of the second word line exit subregions 206B may be at least partially (e.g., substantially) confined with horizontal boundaries in the Y-direction of the first array region 202A and the third array region 202C.

As described in further detail below, an individual first word line exit subregion 206A may be configured and positioned to facilitate electrical connections between a group of word lines 216 (e.g., odd word lines, even word lines) and a group of control logic devices (e.g., odd SWD devices, even SWD devices) operatively associated with a portion (e.g., a half portion in the Y-direction) of one (1) array region 202 (e.g., the first array region 202A) of a pair of horizontally neighboring array regions 202, and to also facilitate electrical connections between a group of additional word lines 216 (e.g., additional odd word lines, additional even word lines) and a group of additional control logic devices (e.g., additional odd SWD devices, additional even SWD devices) operatively associated with a corresponding portion (e.g., a corresponding half portion in the Y-direction) of a further array region 202 (e.g., the third array region 202C) of the pair of horizontally neighboring array regions 202. In addition, as also described in further detail below, an individual second word line exit subregion 206B may be configured and positioned to facilitate electrical connections between a group of further word lines 216 and a group of further control logic devices operatively associated with another portion (e.g., another half portion in the Y-direction) of the one (1) array region 202 (e.g., the first array region 202A), and to also facilitate electrical connections between a group of yet further word lines 216 and a group of yet further control logic devices operatively associated with a corresponding another portion (e.g., a corresponding another half portion in the Y-direction) of the further array region 202 (e.g., the third array region 202C).

With continued reference to FIG. 2, the socket regions 208 of the memory array structure 200 may comprise horizontal areas of the memory array structure 200 including conductive contact structures and conductive routing structures configured and positioned to facilitate electrical connections between one or more other features of the memory array structure 200 and BEOL structures of the microelectronic device 100 (FIG. 1). The BEOL structures may, for example, be positioned within or above the control circuitry structure 300 (FIG. 1) of the microelectronic device 100 (FIG. 1). Optionally, the socket regions 208 may also include capacitor structures configured to be coupled to and employed to assist with powering additional devices (e.g., control logic devices, access devices) of the microelectronic device 100 (FIG. 1). The socket regions 208 may horizontally neighbor one or more peripheral horizontal boundaries (e.g., in the Y-direction, in the X-direction) of one or more groups of the array regions 202. For clarity and ease of understanding of the drawings and related description, FIG. 2 depicts the memory array structure 200 as being formed to include one (1) socket region 208 horizontally neighboring a shared horizontal boundary of the second array region 202B and the fourth array region 202D. However, the memory array structure 200 may be formed to include one or more of a different quantity and a different horizontal position of socket region(s) 208. As a non-limiting example, the socket region 208 may horizontally neighbor a shared horizontal boundary of a different group of the array regions 202 (e.g., a shared horizontal boundary of the third array region 202C and the fourth array region 202D, a shared horizontal boundary of the first array region 202A and the third array region 202C, a shared horizontal boundary of the first array region 202A and the second array region 202B). As another non-limiting example, the memory array structure 200 may be formed to include multiple (e.g., a plurality of, more than one) socket regions 208 horizontally neighboring different groups of the array regions 202 than one another. In some embodiments, multiple socket regions 208 collectively substantially horizontally surround (e.g., substantially horizontally circumscribe) the array regions 202.

Figure 3:
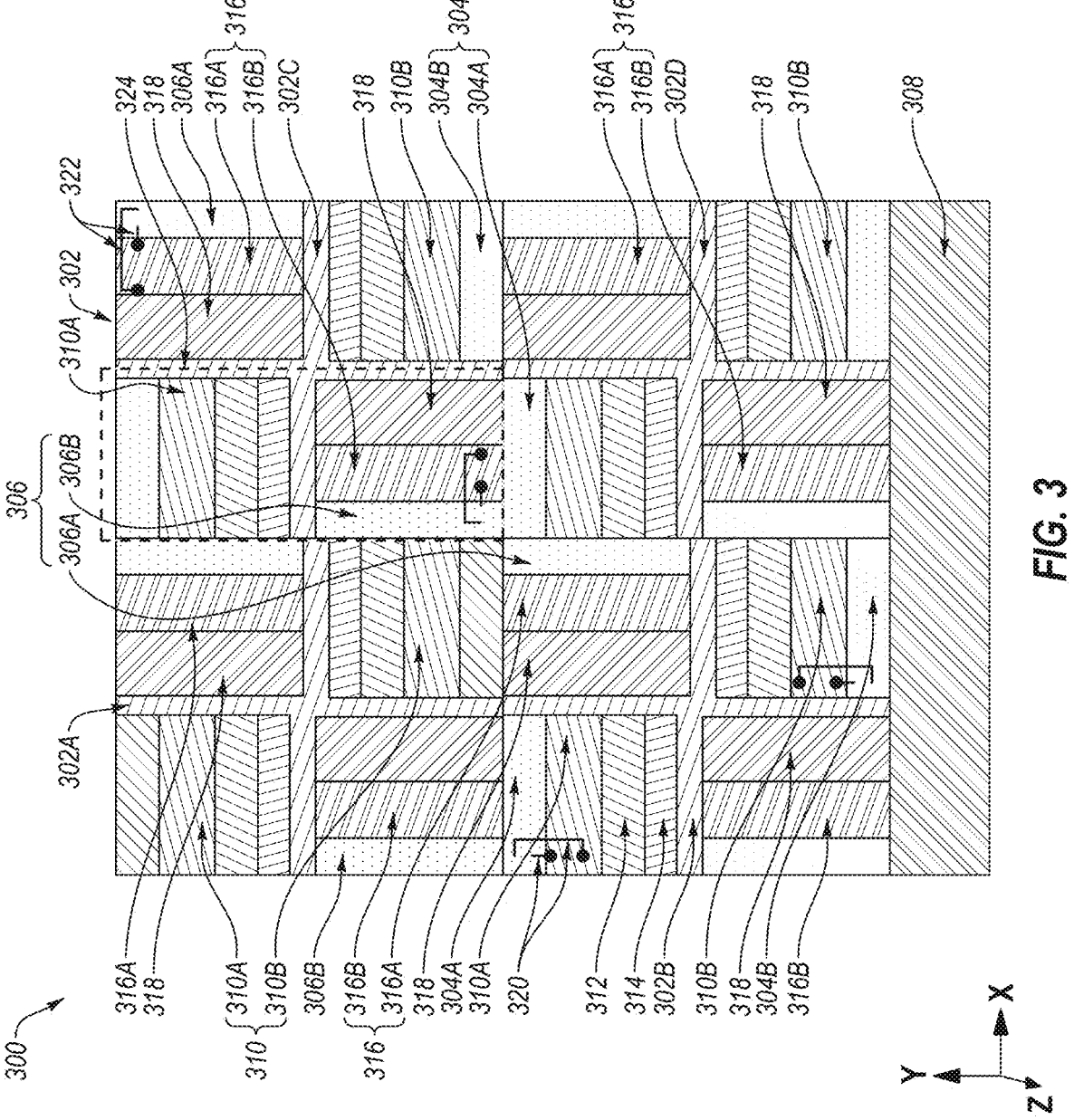
FIG. 3 is a simplified, schematic view of a control circuitry structure for the microelectronic device depicted in FIG. 1, in accordance with some embodiments of the disclosure.

FIG. 3 is a simplified, schematic view of a portion of the control circuitry structure 300 of the microelectronic device 100 (FIG. 1), in accordance with some embodiments of the disclosure. The control circuitry structure 300 may include control circuitry regions 302 and additional control circuitry regions 308 horizontally neighboring some of the control circuitry regions 302 in one or more of the X-direction and the Y-direction. The control circuitry regions 302 and the additional control circuitry regions 308 of the control circuitry structure 300 are each described in further detail below.

The control circuitry regions 302 of the control circuitry structure 300 may comprise regions of the control circuitry structure 300 having control logic circuitry of the microelectronic device 100 (FIG. 1) within horizontal areas thereof. The control logic circuitry of the control circuitry regions 302 of the control circuitry structure 300 may be operatively associated with circuitry (e.g., memory cells) of the memory array structure 200 (FIG. 2) of the microelectronic device 100 (FIG. 1), as described in further detail below. The control circuitry structure 300 may be formed to include a desired quantity of the control circuitry regions 302. In some embodiments, a quantity of the control circuitry regions 302 of the control circuitry structure 300 substantially equals a quantity of the array regions 202 (FIG. 2) of the memory array structure 200 (FIG. 2) vertically thereunder. Each control circuitry region 302 may at least partially (e.g., substantially) horizontally overlap a respective array region 202 (FIG. 2) of the memory array structure 200 (FIG. 2). In some embodiments, a horizontal center (e.g., in the X-direction and the Y-direction) of each control circuitry region 302 of the control circuitry structure 300 is substantially horizontally aligned with a horizontal center (e.g., in the X-direction and the Y-direction) of a respective array region 202 (FIG. 2) of the memory array structure 200 (FIG. 2).

For clarity and ease of understanding of the drawings and related description, FIG. 3 depicts the control circuitry regions 302 as including four (4) control circuitry regions 302: a first control circuitry region 302A, a second control circuitry region 302B, a third control circuitry region 302C, and a fourth control circuitry region 302D. As shown in FIG. 3, the second control circuitry region 302B may horizontally neighbor the first control circuitry region 302A in the Y-direction, and may horizontally neighbor the fourth control circuitry region 302D in the X-direction; the third control circuitry region 302C may horizontally neighbor the first control circuitry region 302A in the X-direction, and may horizontally neighbor the fourth control circuitry region 302D in the Y-direction; and the fourth control circuitry region 302D may horizontally neighbor the third control circuitry region 302C in the Y-direction, and may horizontally neighbor the second control circuitry region 302B in the X-direction. The first control circuitry region 302A may at least partially (e.g., substantially) horizontally overlap the first array region 202A (FIG. 2) of the memory array structure 200 (FIG. 2); the second control circuitry region 302B may at least partially (e.g., substantially) horizontally overlap the second array region 202B of the memory array structure 200 (FIG. 2); the third control circuitry region 302C may at least partially (e.g., substantially) horizontally overlap the third array region 202C (FIG. 2) of the memory array structure 200 (FIG. 2); and the fourth control circuitry region 302D may at least partially (e.g., substantially) horizontally overlap the fourth array region 202D (FIG. 2) of the memory array structure 200 (FIG. 2). However, the control circuitry structure 300 may include a different quantity of control circuitry regions 302. For example, the control circuitry structure 300 may be formed to include greater than four (4) control circuitry regions 302, such as greater than or equal to eight (8) control circuitry regions 302, greater than or equal to sixteen (16) control circuitry regions 302, greater than or equal to thirty-two (32) control circuitry regions 302, greater than or equal to sixty-four (64) control circuitry regions 302, greater than or equal to one hundred twenty-eight (128) control circuitry regions 302, greater than or equal to two hundred fifty-six (256) control circuitry regions 302, greater than or equal to five hundred twelve (512) control circuitry regions 302, or greater than or equal to one thousand twenty-four (1024) control circuitry regions 302.

Within a horizontal area of an individual control circuitry region 302, the control circuitry structure 300 may include, without limitation, digit line contact sections 304, word line contact sections 306, SA sections 310, column decoder sections 312, mini-gap (MG) sections 314, SWD sections 316, and main word line driver (MWD) sections 318. An individual SA section 310 may be horizontally interposed, in the Y-direction, between an individual digit line contact section 304 and an individual column decoder section 312; and the column decoder section 312 may be horizontally interposed, in the Y-direction, between the SA section 310 and an individual MG section 314. In addition, an individual SWD section 316 may be horizontally interposed, in the X-direction, between an individual word line contact section 306 and an individual MWD section 318; and the MWD section 318 may be horizontally interposed, in the X-direction, between the SWD section 316 and each of an individual digit line contact section 304, an individual SA section 310, an individual column decoder section 312, and an individual MG section 314. The digit line contact sections 304, the word line contact sections 306, the SA sections 310, the column decoder sections 312, the MG sections 314, SWD sections 316, and the MWD sections 318 of the control circuitry structure 300 are each described in further detail below.

The digit line contact sections 304 of the control circuitry structure 300 may comprise horizontal areas of the control circuitry structure 300 including digit line routing and contact structures 320 in electrical communication with respective digit lines 214 (FIG. 2) of the memory array structure 200 (FIG. 2) terminating within respective digit line exit regions 204 (FIG. 2) of the memory array structure 200 (FIG. 2). The digit line routing and contact structures 320 may, for example, be coupled to conductive contact structures within the digit line exit regions 204 (FIG. 2) and coupled to the digit lines 214 (FIG. 2). The digit line routing and contact structures 320 may couple the digit lines 214 (FIG. 2) of the memory array structure 200 (FIG. 2) to SA devices within the SA sections 310 of the control circuitry structure 300, as described in further detail below.

As shown in FIG. 3, the digit line contact sections 304 within the horizontal area of an individual control circuitry region 302 (e.g., the first control circuitry region 302A, the second control circuitry region 302B, the third control circuitry region 302C, or the fourth control circuitry region 302D) may include a first digit line contact section 304A and a second word line contact section 304B. For an individual control circuitry region 302, the first digit line contact section 304A and the second word line contact section 304B may be positioned at or proximate different corners of the control circuitry region 302 than one another. For example, the first digit line contact section 304A may be positioned at or proximate one corner of the control circuitry region 302, and the second word line contact section 304B may be positioned at or proximate another corner of the control circuitry region 302 diagonally opposing the corner of the control circuitry region 302.

The first digit line contact sections 304A of the control circuitry structure 300 may be operatively associated with the first digit line exit subregions 204A (FIG. 2) of the memory array structure 200 (FIG. 2); and the second digit line contact sections 304B of the control circuitry structure 300 may be operatively associated with the second digit line exit subregions 204B (FIG. 2) of the memory array structure 200 (FIG. 2). For example, groups of the digit line routing and contact structures 320 within horizontal areas of the first digit line contact sections 304A may be coupled to respective groups of the digit lines 214 (FIG. 2) terminating within the first digit line exit subregions 204A (FIG. 2) of the memory array structure 200 (FIG. 2); and additional groups of the digit line routing and contact structures 320 within horizontal areas of the second digit line contact sections 304B may be coupled to respective additional groups of digit lines 214 (FIG. 2) terminating within the second digit line exit subregions 204B (FIG. 2) of the memory array structure 200 (FIG. 2).

Referring collectively to FIGS. 2 and 3, individual digit line contact sections 304 of the control circuitry structure 300 may be at least partially (e.g., substantially) horizontally offset, in the Y-direction, from individual digit line exit regions 204 of the memory array structure 200 most horizontally proximate thereto in the Y-direction. For example, an individual first digit line contact section 304A may be horizontally offset, in the Y-direction, from an individual first digit line exit subregion 204A most horizontally proximate thereto; and an individual second digit line contact section 304B may be horizontally offset, in the Y-direction, from an individual second digit line exit subregion 204B most horizontally proximate thereto. To account for the horizontal offset of the digit line contact sections 304 relative to the digit line exit regions 204, conductive routing structures may be vertically interposed between and coupled to the digit line routing and contact structures 320 within the digit line contact sections 304 and conductive contact structures (e.g., digit line contact structures) within the digit line exit regions 204. The conductive routing structures may horizontally extend, in the Y-direction, between the digit line routing and contact structures 320 and the conductive contact structures. In additional embodiments, the individual digit line contact sections 304 of the control circuitry structure 300 may at least partially (e.g., substantially) horizontally overlap, in the Y-direction, individual digit line exit regions 204 of the memory array structure 200 most horizontally proximate thereto. For example, an individual first digit line contact section 304A may at least partially (e.g., substantially) overlap, in the Y-direction, an individual first digit line exit subregion 204A most horizontally proximate thereto; and an individual second digit line contact section 304B may at least partially (e.g., substantially) horizontally overlap, in the Y-direction, an individual second digit line exit subregion 204B most horizontally proximate thereto. In some such embodiments, the digit line routing and contact structures 320 within the digit line contact sections 304 may be coupled to the conductive contact structures (e.g., the digit line contact structures) within the digit line exit regions 204 in the absence of (e.g., without employing) conductive routing structures vertically between and coupled to the digit line routing and contact structures 320 and the conductive contact structures.

Referring again to FIG. 3, the word line contact sections 306 of the control circuitry structure 300 may comprise horizontal areas of the control circuitry structure 300 including word line routing and contact structures 322 in electrical communication with respective word lines 216 (FIG. 2) of the memory array structure 200 (FIG. 2) terminating within respective word line exit regions 206 (FIG. 2) of the memory array structure 200 (FIG. 2). The word line routing and contact structures 322 may, for example, be coupled to conductive contact structures within the word line exit regions 206 (FIG. 2) and coupled to the word lines 216 (FIG. 2). The word line routing and contact structures 322 may couple the word lines 216 (FIG. 2) of the memory array structure 200 (FIG. 2) to SWD circuitry within the SWD sections 316 of the control circuitry structure 300, as described in further detail below.

As shown in FIG. 3, the word line contact sections 306 within the horizontal area of an individual control circuitry region 302 (e.g., the first control circuitry region 302A, the second control circuitry region 302B, the third control circuitry region 302C, or the fourth control circuitry region 302D) may include a first word line contact section 306A and a second first word line contact section 306B. For an individual control circuitry region 302, the first word line contact section 306A and the second first word line contact section 306B may be positioned at or proximate different corners of the control circuitry region 302 than one another and the digit line contact sections 304. For example, the first word line contact section 306A may be positioned at or proximate an additional corner of the control circuitry region 302 different than those most proximate to the digit line contact sections 304, and the second first word line contact section 306B may be positioned at or proximate a further corner of the control circuitry region 302 diagonally oppos-
ing the additional corner of the control circuitry region 302.

The first word line contact sections 306A of the control
circuitry structure 300 may be operatively associated with
the first word line exit subregions 206A (FIG. 2) of the
memory array structure 200 (FIG. 2); and the second word
line contact sections 306B of the control circuitry structure
300 may be operatively associated with the second word line
exit subregions 206B (FIG. 2) of the memory array structure
200 (FIG. 2). For example, groups of the word line routing
and contact structures 322 within horizontal areas of the first
word line contact sections 306A may be coupled to respec-
tive groups of the word lines 216 (FIG. 2) terminating within
the first word line exit subregions 206A (FIG. 2) of the
memory array structure 200 (FIG. 2); and additional groups
of the word line routing and contact structures 322 within
horizontal areas of the second word line contact sections
306B may be coupled to respective additional groups of
word lines 216 (FIG. 2) terminating within the second word
line exit subregions 206B (FIG. 2) of the memory array
structure 200 (FIG. 2).

Referring collectively to FIGS. 2 and 3, individual word
line contact sections 306 of the control circuitry structure
300 may be at least partially (e.g., substantially) horizontally
offset, in the X-direction, from individual word line exit
regions 206 of the memory array structure 200 most hori-
zontally proximate thereto in the X-direction. For example,
an individual first word line contact section 306A may be
horizontally offset, in the X-direction, from an individual
first word line exit subregion 206A most horizontally proxi-
mate thereto; and an individual second word line contact
section 306B may be horizontally offset, in the X-direction,
from an individual second word line exit subregion 206B
most horizontally proximate thereto. To account for the
horizontal offset of the word line contact sections 306
relative to the word line exit regions 206, additional con-
ductive routing structures may be vertically interposed
between and coupled to the word line routing and contact
structures 322 within the word line contact sections 306 and
additional conductive contact structures (e.g., word line
contact structures) within the word line exit regions 206. The
additional conductive routing structures may horizontally
extend, in the X-direction, between the word line routing
and contact structures 322 and the additional conductive
contact structures. In additional embodiments, the individual
word line contact sections 306 of the control circuitry
structure 300 may at least partially (e.g., substantially)
horizontally overlap, in the X-direction, individual word line
exit regions 206 of the memory array structure 200 most
horizontally proximate thereto. For example, an individual
first word line contact section 306A may at least partially
(e.g., substantially) overlap, in the X-direction, an individual
first word line exit subregion 206A most horizontally proxi-
mate thereto; and an individual second word line contact
section 306B may at least partially (e.g., substantially)
horizontally overlap, in the X-direction, an individual sec-
ond word line exit subregion 206B most horizontally proxi-
mate thereto. In some such embodiments, the word line
routing and contact structures 322 within the word line
contact sections 306 may be coupled to the additional
conductive contact structures (e.g., the word line contact
structures) within the word line exit regions 206 in the
absence of (e.g., without employing) additional conductive
routing structures vertically between and coupled to the
word line routing and contact structures 322 and the addi-
tional conductive contact structures.

Referring again to FIG. 3, the SA sections 310 of the
control circuitry structure 300 may horizontally neighbor
respective digit line contact sections 304 in the Y-direction
and may individually include SA devices and circuitry
coupled to the digit line routing and contact structures 320
within and horizontally extending from respective digit line
contact sections 304. Accordingly, the SA devices within the
SA sections 310 of the control circuitry structure 300 may be
coupled to the digit lines 214 (FIG. 2) vertically underlying
(e.g., in the Z-direction) the control circuitry structure 300
and may be coupled to the digit line routing and contact
structures 320. In some embodiments, the SA devices are PN
SA (PNSA) devices including P-type semiconductors and
N-type semiconductors to amplify voltage changes. In addi-
tional embodiments, the SA devices are N SA (NSA) devices
including N-type semiconductors to amplify voltage
changes. In further embodiments, the SA devices are P SA
(PSA) devices including P-type semiconductors to amplify
voltage changes.

The SA sections 310 of the control circuitry structure 300
may include first SA sections 310A and second SA sections
310B. In some embodiments, within a horizontal area an
individual control circuitry region 302 (e.g., the first control
circuitry region 302A, the second control circuitry region
302B, the third control circuitry region 302C, or the fourth
control circuitry region 302D), the control circuitry structure
300 includes one (1) first SA section 310A and one (1)
second SA section 310B. The first SA section 310A may
horizontally neighbor, in the Y-direction, a first digit line
contact section 304A within the control circuitry region 302;
and the second SA section 310B may horizontally neighbor,
in the Y-direction, a second digit line contact section 304B
within the control circuitry region 302. In some embodi-
ments, for an individual control circuitry region 302, the first
SA section 310A thereof is directly horizontally adjacent, in
the Y-direction, the first digit line contact section 304A
thereof; and the second SA section 310B thereof is directly
horizontally adjacent, in the Y-direction, the second digit
line contact section 304B thereof. In additional embodi-
ments, depending on how the digit line routing and contact
structures 320 are coupled to the digit lines 214 (FIG. 2)
within the memory array structure 200 (FIG. 2), the posi-
tions of the first SA sections 310A and the second SA
sections 310B are switched (e.g., swapped) relative to the
arrangements depicted in FIG. 3.

First SA sections 310A of control circuitry regions 302
horizontally neighboring one another in the Y-direction and
substantially horizontally aligned with one another in the
X-direction (e.g., the first control circuitry region 302A and
the second control circuitry region 302B; the third control
circuitry region 302C and the fourth control circuitry region
302D) may be coupled to different groups of digit lines 214
(FIG. 2) of the memory array structure 200 (FIG. 2) than one
another. For example, the first SA section 310A of the first
control circuitry region 302A may include so-called "even"
SA devices coupled to so-called "even" digit lines 214 (FIG.
2) within the memory array structure 200 (FIG. 2) by way
of the digit line routing and contact structures 320 associated
with the first SA section 310A; and the first SA section 310A
of the second control circuitry region 302B may include
so-called "odd" SA devices coupled to so-called "odd" digit
lines 214 (FIG. 2) within the memory array structure 200
(FIG. 2) by way of the digit line routing and contact
structures 320 associated with the first SA section 310A; or
vice versa. The even digit lines 214 (FIG. 2) of the memory
array structure 200 (FIG. 2) may horizontally alternate with
the odd digit lines 214 (FIG. 2) of the memory array structure 200 (FIG. 2) in the X-direction. Similarly, the second SA section 310B of the first control circuitry region 302A may include additional even SA devices coupled to additional even digit lines 214 (FIG. 2) within the memory array structure 200 (FIG. 2) by way of the digit line routing and contact structures 320 associated with the second SA section 310B; and the second SA section 310B of the second control circuitry region 302B may include additional odd SA devices coupled to so-called additional odd digit lines 214 (FIG. 2) within the memory array structure 200 (FIG. 2) by way of the digit line routing and contact structures 320 associated with the second SA section 310B; or vice versa.

Within an individual control circuitry region 302, the first SA section 310A and the second SA section 310B within a horizontal area thereof may each include odd SA devices (but not even SA devices); the first SA section 310A and the second SA section 310B within a horizontal area thereof may each include even SA devices (but not odd SA devices); or the first SA section 310A within a horizontal area thereof may include one of odd SA devices and even SA devices, and the second SA section 310B within a horizontal area thereof may include the other of odd SA devices and even SA devices. However, within another control circuitry region 302 horizontally neighboring the control circuitry region 302 in the Y-direction and substantially horizontally aligned with control circuitry region 302 in the X-direction, the SA devices of the first SA section 310A and the second SA section 310B thereof are respectively different (in terms of odd SA devices versus even SA devices) than the SA devices of the first SA section 310A and the second SA section 310B of the control circuitry region 302. For example, if the first SA section 310A and the second SA section 310B of the first control circuitry region 302A each include even SA devices, the first SA section 310A and the second SA section 310B of the second control circuitry region 302B may each include odd SA devices. As another example, if the first SA section 310A and the second SA section 310B of the first control circuitry region 302A each include odd SA devices, the first SA section 310A and the second SA section 310B of the second control circuitry region 302B may each include even SA devices. As an additional example, if the first SA section 310A of the first control circuitry region 302A includes even SA devices and the second SA section 310B of the first control circuitry region 302A includes odd SA devices, the first SA section 310A of the second control circuitry region 302B may include odd SA devices and the second SA section 310B of the second control circuitry region 302B may include even SA devices.

The SA devices (e.g., odd SA devices, even SA devices) within an individual SA section 310 of an individual control circuitry region 302 may be coupled to digit lines 214 (FIG. 2) (e.g., odd digit lines, even digit lines) horizontally extending through the control circuitry region 302, and may also be coupled to additional digit lines 214 (FIG. 2) (e.g., additional odd digit lines, additional even digit lines) horizontally extending through another control circuitry region 302 horizontally neighboring the control circuitry region 302 in the Y-direction and substantially horizontally aligned with the control circuitry region 302 in the X-direction. For example, if the first SA section 310A of the second control circuitry region 302B includes odd SA devices, a portion of the odd SA devices may be coupled to odd digit lines 214 (FIG. 2) horizontally extending through the second control circuitry region 302B by way of some digit line routing and contact structures 320 extending through the first digit line contact section 304A within the second control circuitry region 302B, and another portion of the odd SA devices may be coupled to additional odd digit lines 214 (FIG. 2) horizontally extending through the first control circuitry region 302A by way of some additional digit line routing and contact structures 320 extending through the first digit line contact section 304A. As another example, if the second SA section 310B of the first control circuitry region 302A includes even SA devices, a portion of the even SA devices may be coupled to even digit lines 214 (FIG. 2) horizontally extending through the first control circuitry region 302A by way of some digit line routing and contact structures 320 extending through the second digit line contact section 304B within the first control circuitry region 302A; and another portion of the even SA devices within the second SA section 310B of the first control circuitry region 302A may be coupled to additional even digit lines 214 (FIG. 2) horizontally extending through the second control circuitry region 302B by way of some additional digit line routing and contact structures 320 extending through the second digit line contact section 304B within the first control circuitry region 302A.

Still referring to FIG. 3, the column decoder sections 312 of the control circuitry structure 300 may horizontally neighbor respective SA sections 310 in the Y-direction, and may individually include column decoder devices and circuitry configured to select individual columns of memory cells 218 (FIG. 2) within the memory array structure 200 (FIG. 2) (e.g., for read operations, for write operations) during use and operation of the microelectronic device 100 (FIG. 1). The column decoder sections 312 may individually be horizontally positioned, in the Y-direction, at or proximate a side (e.g., a horizontal boundary) of a respective SA section 310 opposing an additional side (e.g., an additional horizontal boundary) of the SA section 310 relatively more proximate to a respective digit line contact section 304 (e.g., a first digit line contact section 304A, a second digit line contact section 304B) of the control circuitry structure 300. An individual control circuitry region 302 (e.g., the first control circuitry region 302A, the second control circuitry region 302B, the third control circuitry region 302C, or the fourth control circuitry region 302D) may include two (2) column decoder sections 312 within a horizontal area thereof, wherein each of the two (2) column decoder sections 312 horizontally neighbors one (1) of the two (2) SA sections 310 within the horizontal area the control circuitry region 302.

The MG sections 314 of the control circuitry structure 300 may horizontally neighbor respective column decoder sections 312 in the Y-direction, and may each include different conductive routing structures (e.g., control signal routing structures, column select routing structures, global input/output (GIO) routing structures, local input/output (LIO) routing structures, bussing routing structures) of the microelectronic device 100 (FIG. 1) within a horizontal area thereof. For an individual MG section 314, the conductive routing structures may individually horizontally extend (e.g., in the X-direction, in the Y-direction) through the MG section 314 en route to various control circuitry and devices of the control circuitry structure 300. Different conductive routing structures within horizontal areas of the MG sections 314 may be positioned at different vertical elevations (e.g., in the Z-direction) than one another. The MG sections 314 may individually be horizontally positioned, in the Y-direction, at or proximate a side (e.g., a horizontal boundary) of a respective column decoder section 312 opposing an additional side (e.g., an additional horizontal boundary) of the column decoder section 312 relatively more proximate to a respective SA section 310 (e.g., a first SA section 310A, a second SA section 310B) of the control circuitry structure 300. In additional embodiments, the positions of the MG section 314 and the column decoder section 312 are switched (e.g., swapped) relative to the arrangements depicted in FIG. 3. For example, an individual MG section 314 may be horizontally interposed, in the Y-direction, between an individual SA section 310 and an individual column decoder section 312. An individual control circuitry region 302 (e.g., the first control circuitry region 302A, the second control circuitry region 302B, the third control circuitry region 302C, or the fourth control circuitry region 302D) may include two (2) MG sections 314 within a horizontal area thereof, wherein each of the two (2) MG sections 314 horizontally neighbors one (1) of the two (2) column decoder sections 312 within the horizontal area the control circuitry region 302.

Still referring to FIG. 3, the SWD sections 316 of the control circuitry structure 300 may horizontally neighbor respective word line contact sections 306 in the X-direction and may individually include SWD devices and circuitry coupled to the word line routing and contact structures 322 within and horizontally extending from respective word line contact sections 306. Accordingly, the SWD devices within the SWD sections 316 of the control circuitry structure 300 may be coupled to the word lines 216 (FIG. 2) vertically underlying (e.g., in the Z-direction) the control circuitry structure 300 and coupled to the word line routing and contact structures 322.

The SWD sections 316 of the control circuitry structure 300 may include first SWD sections 316A and second SWD sections 316B. In some embodiments, within a horizontal area an individual control circuitry region 302 (e.g., the first control circuitry region 302A, the second control circuitry region 302B, the third control circuitry region 302C, or the fourth control circuitry region 302D), the control circuitry structure 300 includes one (1) first SWD section 316A and one (1) second SWD section 316B. The first SWD section 316A may horizontally neighbor, in the X-direction, a first word line contact section 306A within the control circuitry region 302; and the second SWD section 316B may horizontally neighbor, in the X-direction, a second word line contact section 306B within the control circuitry region 302. In some embodiments, for an individual control circuitry region 302, the first SWD section 316A thereof is directly horizontally adjacent, in the X-direction, the first word line contact section 306A thereof; and the second SWD section 316B thereof is directly horizontally adjacent, in the X-direction, the second word line contact section 306B thereof. In additional embodiments, depending on how the word line routing and contact structures 322 are coupled to the word lines 216 (FIG. 2) within the memory array structure 200 (FIG. 2), the positions of the first SWD sections 316A and the second SWD sections 316B are switched (e.g., swapped) relative to the arrangements depicted in FIG. 3.

First SWD sections 316A of control circuitry regions 302 horizontally neighboring one another in the X-direction and substantially horizontally aligned with one another in the Y-direction (e.g., the first control circuitry region 302A and the third control circuitry region 302C; the second control circuitry region 302B and the fourth control circuitry region 302D) may be coupled to different groups of word lines 216 (FIG. 2) of the memory array structure 200 (FIG. 2) than one another. For example, the first SWD section 316A of the first control circuitry region 302A may include so-called "even" SWD devices coupled to so-called "even" word lines 216 (FIG. 2) within the memory array structure 200 (FIG. 2) by way of the word line routing and contact structures 322 associated with the first SWD section 316A; and the first SWD section 316A of the third control circuitry region 302C may include so-called "odd" SWD devices coupled to so-called "odd" word lines 216 (FIG. 2) within the memory array structure 200 (FIG. 2) by way of the word line routing and contact structures 322 associated with the first SWD section 316A; or vice versa. The even word lines 216 (FIG. 2) of the memory array structure 200 (FIG. 2) may horizontally alternate with the odd word lines 216 (FIG. 2) of the memory array structure 200 (FIG. 2) in the Y-direction. Similarly, the second SWD section 316B of the first control circuitry region 302A may include additional even SWD devices coupled to additional even word lines 216 (FIG. 2) within the memory array structure 200 (FIG. 2) by way of the word line routing and contact structures 322 associated with the second SWD section 316B; and the second SWD section 316B of the third control circuitry region 302C may include additional odd SWD devices coupled to so-called additional odd word lines 216 (FIG. 2) within the memory array structure 200 (FIG. 2) by way of the word line routing and contact structures 322 associated with the second SWD section 316B; or vice versa.

Within an individual control circuitry region 302, the first SWD section 316A and the second SWD section 316B within a horizontal area thereof may each include odd SWD devices (but not even SWD devices); the first SWD section 316A and the second SWD section 316B within a horizontal area thereof may each include even SWD devices (but not odd SWD devices); or the first SWD section 316A within a horizontal area thereof may include one of odd SWD devices and even SWD devices, and the second SWD section 316B within a horizontal area thereof may include the other of odd SWD devices and even SWD devices. However, within another control circuitry region 302 horizontally neighboring the control circuitry region 302 in the X-direction horizontally aligned with control circuitry region 302 in the Y-direction, the SWD devices of the first SWD section 316A and the second SWD section 316B thereof are respectively different (in terms of odd SWD devices versus even SWD devices) than the SWD devices of the first SWD section 316A and the second SWD section 316B of the control circuitry region 302. For example, if the first SWD section 316A and the second SWD section 316B of the first control circuitry region 302A each include even SWD devices, the first SWD section 316A and the second SWD section 316B of the third control circuitry region 302C may each include odd SWD devices. As another example, if the first SWD section 316A and the second SWD section 316B of the first control circuitry region 302A each include odd SWD devices, the first SWD section 316A and the second SWD section 316B of the third control circuitry region 302C may each include even SWD devices. As an additional example, if the first SWD section 316A of the first control circuitry region 302A includes even SWD devices and the second SWD section 316B of the first control circuitry region 302A includes odd SWD devices, the first SWD section 316A of the third control circuitry region 302C may include odd SWD devices and the second SWD section 316B of the third control circuitry region 302C may include even SWD devices.

The SWD devices (e.g., odd SWD devices, even SWD devices) within an individual SWD section 316 of an individual control circuitry region 302 may be coupled to word lines 216 (FIG. 2) (e.g., odd digit lines, even digit lines) horizontally extending through the control circuitry region 302, and may also be coupled to additional word lines 216 (FIG. 2) (e.g., additional odd digit lines, additional even digit lines) horizontally extending through another control circuitry region 302 horizontally neighboring the control circuitry region 302 in the X-direction and substantially horizontally aligned with the control circuitry region 302 in the Y-direction. For example, if the second SWD section 316B of the third control circuitry region 302C includes odd SWD devices, a portion of the odd SWD devices may be coupled to odd word lines 216 (FIG. 2) horizontally extending through the third control circuitry region 302C by way of some word line routing and contact structures 322 extending through the second word line contact section 306B within the third control circuitry region 302C, and another portion of the odd SWD devices may be coupled to additional odd word lines 216 (FIG. 2) horizontally extending through the first control circuitry region 302A by way of some additional word line routing and contact structures 322 extending through the second word line contact section 306B. As another example, if the first SWD section 316A of the first control circuitry region 302A includes even SWD devices, a portion of the even SWD devices may be coupled to even word lines 216 (FIG. 2) horizontally extending through the first control circuitry region 302A by way of some word line routing and contact structures 322 extending through the first word line contact section 306A within the first control circuitry region 302A; and another portion of the even SWD devices within the first SWD section 316A of the first control circuitry region 302A may be coupled to additional even word lines 216 (FIG. 2) horizontally extending through the third control circuitry region 302C by way of some additional word line routing and contact structures 322 extending through the first word line contact section 306A within the first control circuitry region 302A.

Still referring to FIG. 3, the MWD sections 318 of the control circuitry structure 300 may horizontally neighbor respective SWD sections 316 in the X-direction, and may individually include MWD devices and circuitry of the microelectronic device 100 (FIG. 1). The MWD sections 318 may individually be horizontally positioned, in the X-direction, at or proximate a side (e.g., a horizontal boundary) of a respective SWD section 316 opposing an additional side (e.g., an additional horizontal boundary) of the SWD section 316 relatively more proximate to a respective word line contact section 306 (e.g., a first word line contact section 306A, a second word line contact section 306B) of the control circuitry structure 300. An individual control circuitry region 302 (e.g., the first control circuitry region 302A, the second control circuitry region 302B, the third control circuitry region 302C, or the fourth control circuitry region 302D) may include two (2) MWD sections 318 within a horizontal area thereof, wherein each of the two (2) MWD sections 318 horizontally neighbors one (1) of the two (2) SWD sections 316 within the horizontal area the control circuitry region 302.

Each of the control circuitry regions 302 of the control circuitry structure 300 may include two (2) half-segments 324 (one of which is identified with dashed lines in FIG. 3) and individually include portions of the various sections of the control circuitry regions 302 within a horizontal area thereof. For example, an individual half-segment 324 of an individual control circuitry region 302 may include all of the sections of the control circuitry regions 302 within one-half (½), in the X-direction, of the control circuitry region 302. The half-segment 324 of the control circuitry region 302 may include one (1) digit line contact section 304, one (1) SA section 310, one (1) column decoder section 312, one (1) MG section 314, one (1) word line contact section 306, one (1) SWD section 316, and one MWD section 318. Within the half-segment 324, various conductive routing schemes may be employed to operatively associate control circuitry within the various sections within the half-segment 324 with some of the digit lines 214 (FIG. 2) (and, hence, some of the memory cells 218 (FIG. 2)) within the memory array structure 200 (FIG. 2) and additional control circuitry within the additional control circuitry regions 308 of the control circuitry structure 300. By way of non-limiting example, for an individual half-segment 324, digit line routing and contact structures 320 coupled with at least four (4) digit lines 214 (FIG. 2) within an individual array region 202 (FIG. 2) of the memory array structure 200 (FIG. 2) may be coupled to at least one (1) SA device within the SA section 310; at least four (4) LIO lines may horizontally extend (e.g., in the Y-direction) from the at least one (1) SA device to the MG section 314 (which may have a mixed metal layout), and may be operatively associated with at least four (4) read/write (RW) driver devices by way of the MG section 314.

With continued reference to FIG. 3, the additional control circuitry regions 308 of the control circuitry structure 300 may include additional control circuitry, devices, and structures different than the control circuitry, devices, and structures positioned within the horizontal areas of the control circuitry region 302 of the control circuitry structure 300. By way of non-limiting example, the additional control circuitry regions 308 may include row decoder sections including row decoder devices; bank logic sections including bank logic devices; peripheral circuitry sections including various peripheral circuitry and devices; and/or package interface sections including structures and circuitry (e.g., BEOL structures and circuitry, such as bond pads and conductive routing). The additional control circuitry regions 308 may horizontally neighbor one or more peripheral horizontal boundaries (e.g., in the Y-direction, in the X-direction) of one or more groups of the control circuitry region 302, and may at least partially (e.g., substantially) horizontally overlap the socket regions 208 (FIG. 2) of the memory array structure 200 (FIG. 2). For clarity and ease of understanding of the drawings and related description, FIG. 3 depicts the control circuitry structure 300 as being formed to include one (1) additional control circuitry region 308 horizontally neighboring a shared horizontal boundary of the second control circuitry region 302B and the fourth control circuitry region 302D. However, the control circuitry structure 300 may be formed to include one or more of a different quantity and a different horizontal position of additional control circuitry region(s) 308. As a non-limiting example, the additional control circuitry region 308 may horizontally neighbor a shared horizontal boundary of a different group of the control circuitry regions 302 (e.g., a shared horizontal boundary of the third control circuitry region 302C and the fourth control circuitry region 302D, a shared horizontal boundary of the first control circuitry region 302A and the third control circuitry region 302C, a shared horizontal boundary of the first control circuitry region 302A and the second control circuitry region 302B). As another non-limiting example, the control circuitry structure 300 may be formed to include multiple (e.g., a plurality of, more than one) additional control circuitry regions 308 horizontally neighboring different groups of the control circuitry regions 302 than one another. In some embodiments, multiple additional control circuitry regions 308 collectively substantially horizontally surround (e.g., substantially horizontally circumscribe) the control circuitry regions 302.

In additional embodiments, the microelectronic device 100 is configured to have a different configuration than that previously described herein with reference to FIGS. 1 through 3. The control circuitry structure 300 of the microelectronic device 100 may, for example, have a different general layout of different regions and/or sections thereof than that previously described herein with reference to FIG. 3. The control circuitry structure 300 may, for example, be formed to exhibit a configuration such as one of the configurations depicted in FIGS. 4 through 6 and described in further detail below.

Figure 4:
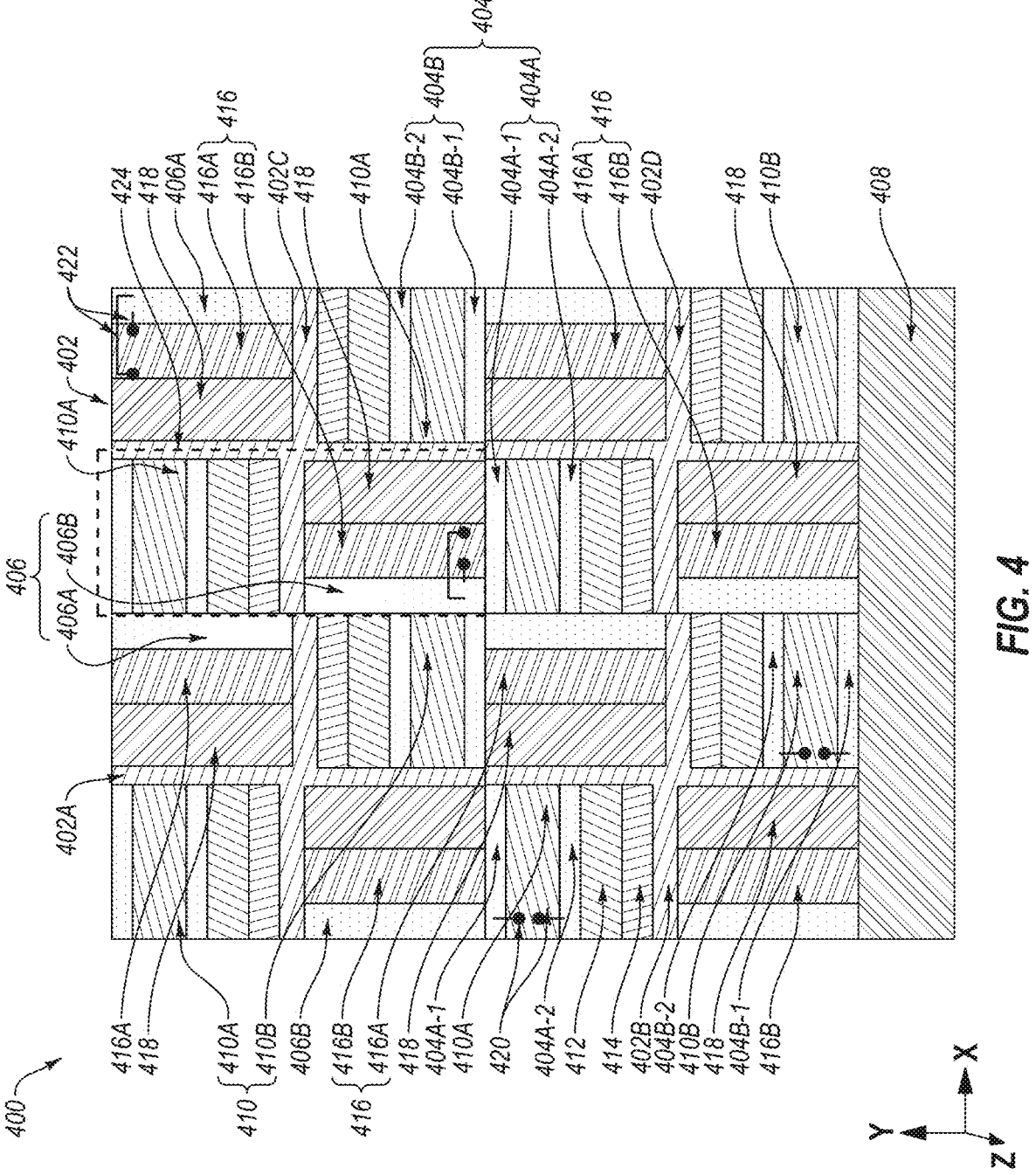
FIG. 4 is a simplified, schematic view of a control circuitry structure for the microelectronic device depicted in FIG. 1, in accordance with additional embodiments of the disclosure.
Figure 5:
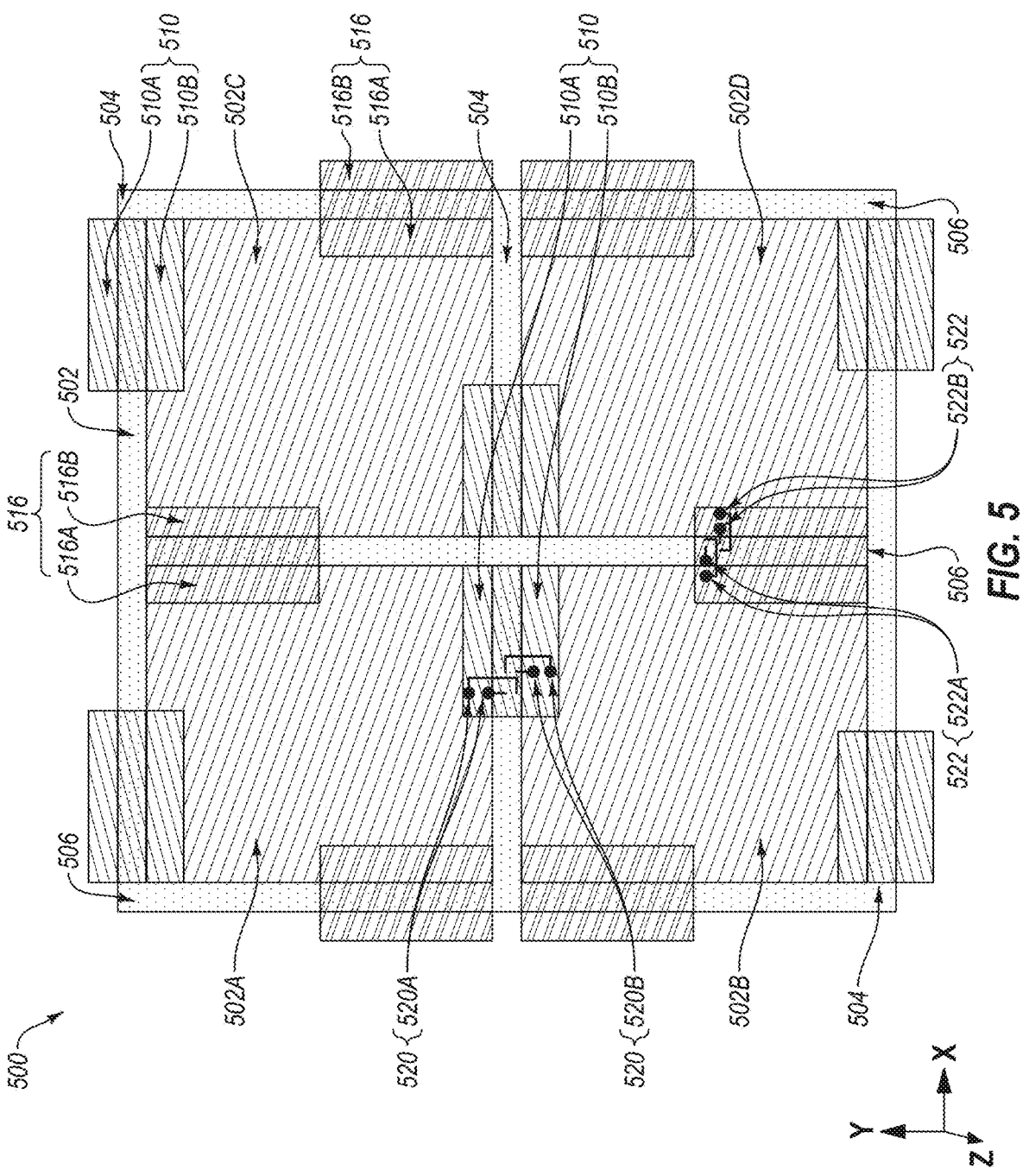
FIG. 5 is a simplified, schematic view of a control circuitry structure for the microelectronic device depicted in FIG. 1, in accordance with yet additional embodiments of the disclosure.
Figure 6:
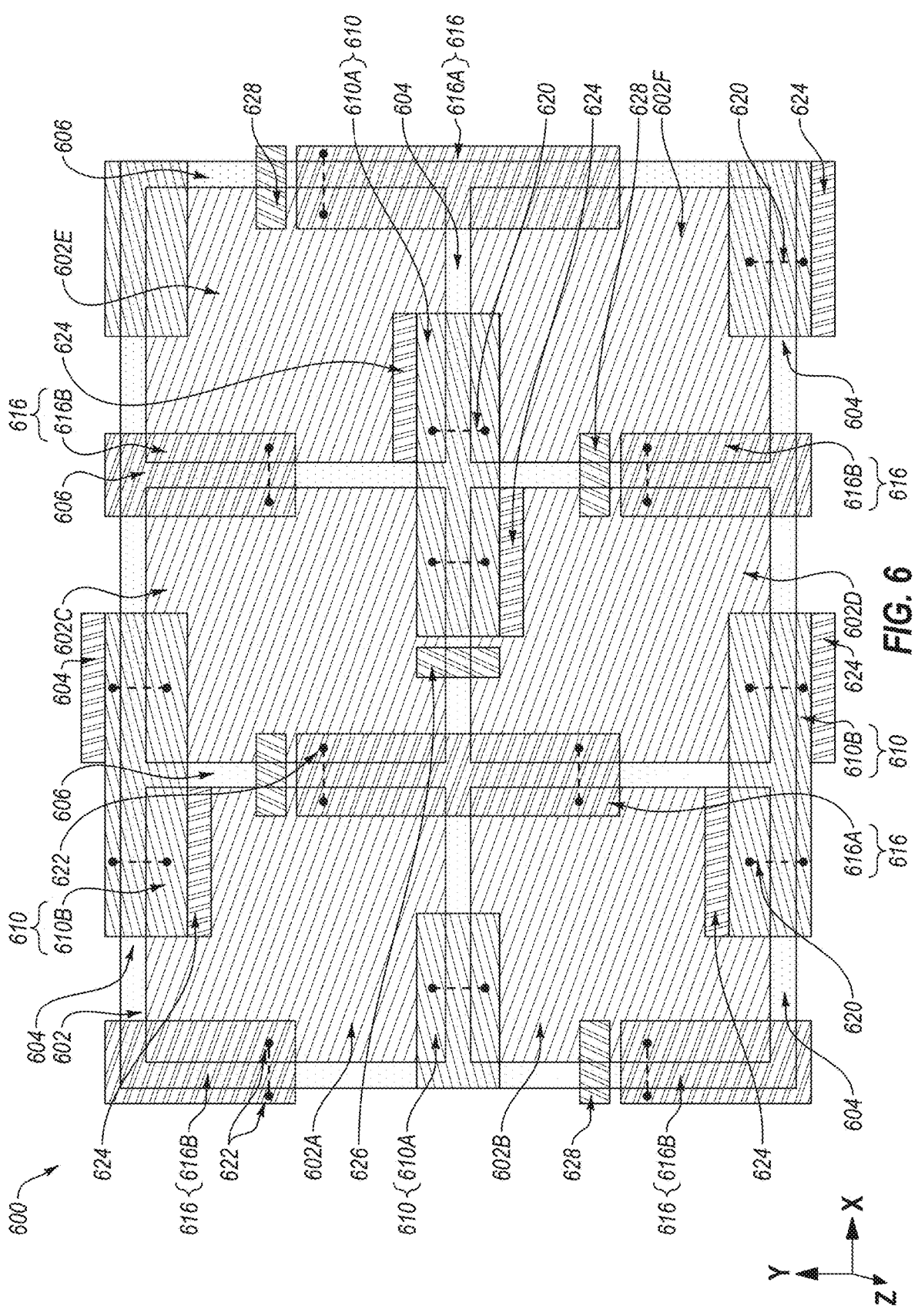
FIG. 6 is a simplified, schematic view of a control circuitry structure for the microelectronic device depicted in FIG. 1, in accordance with further embodiments of the disclosure.

Before referring to FIG. 4, it will be understood that throughout FIGS. 4 through 6 and the associated description, features (e.g., regions, sections, structures, circuitry, devices) functionally similar to respective features previously described with reference to FIG. 3 are referred to with similar reference numerals incremented by 100. To avoid repetition, not all features shown in FIGS. 4 through 6 are described in detail herein. Rather, unless described otherwise below, a feature in one or more of FIGS. 4 through 6 designated by a reference numeral that is a 100 increment of the reference numeral of a feature previously described with reference to FIG. 3 will be understood to be substantially similar to and have substantially the same advantages as the previously described feature. In addition, for clarity and ease of understanding the drawings and related description, some features (e.g., regions, section, structures, circuitry, devices) previously described with reference to FIG. 3 are not depicted in all of FIGS. 4 through 6. However, unless described otherwise below, it will be under that any features of the control circuitry structure 300 previously described with reference to FIG. 3 may be included in any of the different configurations described hereinbelow with reference to FIGS. 4 through 6.

FIG. 4 is a simplified, schematic view of a control circuitry structure 400, in accordance with additional embodiments of the disclosure. The control circuitry structure 400 may be included in place of the control circuitry structure 300 (FIG. 3) within the microelectronic device 100 (FIG. 1). The control circuitry structure 400 may vertically overlie the memory array structure 200 (FIG. 2). Similar to the control circuitry structure 300 (FIG. 3), the control circuitry structure 400 may be formed separate from the memory array structure 200 (FIG. 2), and may be subsequently attached to the memory array structure 200 (FIG. 2) to form another embodiment of the microelectronic device 100 (FIG. 1) through a process substantially similar to that previously described herein with reference to FIG. 1. The control circuitry structure 400 may have some similarities with the control circuitry structure 300 (FIG. 3) but may have different configurations of some features (e.g., regions, sections, structures, circuitry, devices) thereof as compared to respective features of the control circuitry structure 300 (FIG. 3).

As shown in FIG. 4, within horizontal areas of the control circuitry regions 402, the control circuitry structure 400 may include digit line contact sections 404 horizontally neighboring, in the Y-direction, two (2) opposing sides of respective SA sections 410. As described in further detail below, an individual SA section 410 may be horizontally interposed, in the Y-direction, between two (2) digit line contact sections 404. The SA section 410 may at least partially (e.g., substantially) horizontally overlap each of the two (2) digit line contact sections 404 in the X-direction. The SA section 410 may horizontally extend, in the Y-direction, from and between the two (2) digit line contact sections 404. The two (2) digit line contact sections 404 may, in combination, have a function similar to that of a single (e.g., only one) digit line contact section 304 (FIG. 3) of the control circuitry structure

300 (FIG. 3), but may facilitate routing to individual SA devices of a respective SA section 410 from two (2) sides thereof. Such routing may, for example, enhance SA balance.

The digit line contact sections 404 within the horizontal area of an individual control circuitry region 402 (e.g., the first control circuitry region 402A, the second control circuitry region 402B, the third control circuitry region 402C, or the fourth control circuitry region 402D) may include two (2) first digit line contact sections 404A and two (2) second digit line contact sections 404B. The two (2) first digit line contact sections 404A may include a primary first digit line contact section 404A-1 and a secondary first digit line contact section 404A-2. The primary first digit line contact section 404A-1 and the secondary first digit line contact section 404A-2 may exhibit substantially the same horizontal area, substantially the horizontal dimensions, and substantially the horizontal shape as one another. In addition, the two (2) second digit line contact sections 404B may include a primary second digit line contact section 404B-1 and a secondary second digit line contact section 404B-2. The primary second digit line contact section 404B-1 and the secondary second digit line contact section 404B-2 may exhibit substantially the same horizontal area, substantially the horizontal dimensions, and substantially the horizontal shape as one another. For an individual control circuitry region 402, the two (2) first digit line contact sections 404A and the two (2) second digit line contact sections 404B may be positioned at or proximate different corners of the control circuitry region 402 than one another. For example, the two (2) first digit line contact sections 404A may be positioned at or proximate one corner of the control circuitry region 402, and the two (2) second digit line contact sections 404B may be positioned at or proximate another corner of the control circuitry region 402 diagonally opposing the corner of the control circuitry region 402.

Within the horizontal area of an individual control circuitry region 402, the two (2) first digit line contact sections 404A may flank opposing sides, in the Y-direction, of an individual first SA section 410A; and the two (2) second digit line contact sections 404B may flank opposing sides, in the Y-direction, of an individual second SA section 410B. The first SA section 410A may be horizontally interposed, in the Y-direction, between the primary first digit line contact section 404A-1 and the secondary first digit line contact section 404A-2. The secondary first digit line contact section 404A-2 may be horizontally interposed, in the Y-direction, between the first SA section 410A and the column decoder section 412 most horizontally proximate thereto. In addition, the second SA section 410B may be horizontally interposed, in the Y-direction, between the primary second digit line contact section 404B-1 and the secondary second digit line contact section 404B-2. The secondary second digit line contact section 404B-2 may be horizontally interposed, in the Y-direction, between the second SA section 410B and the column decoder section 412 most horizontally proximate thereto.

For an individual control circuitry region 402 of the control circuitry structure 300, the two (2) first digit line contact sections 404A thereof may be operatively associated with an individual first digit line exit subregion 204A (FIG. 2) of the memory array structure 200 (FIG. 2); and the two (2) second digit line contact sections 404B thereof may be operatively associated with an individual second digit line exit subregion 204B (FIG. 2) of the memory array structure 200 (FIG. 2). For example, groups of the digit line routing and contact structures 420 within horizontal areas of the two (2) first digit line contact sections 404A may be coupled to respective groups of the digit lines 214 (FIG. 2) terminating within the first digit line exit subregion 204A (FIG. 2) of the memory array structure 200 (FIG. 2); and additional groups of the digit line routing and contact structures 420 within horizontal areas of the second digit line contact sections 404B may be coupled to respective additional groups of digit lines 214 (FIG. 2) terminating within the second digit line exit subregion 204B (FIG. 2) of the memory array structure 200 (FIG. 2).

In some embodiments, a group of the digit line routing and contact structures 420 within a horizontal area of an individual primary first digit line contact section 404A-1 are coupled to a group of the digit lines 214 (FIG. 2) employed as so-called "base" digit lines (e.g., true digit lines); and an additional group of the digit line routing and contact structures 420 within a horizontal area of an individual secondary first digit line contact section 404A-2 are coupled to an additional group of the digit lines 214 (FIG. 2) employed as so-called "complementary" digit lines (e.g., digit bar lines); or vice versa. As a non-limiting example, if an individual first SA section 410A horizontally interposed between an individual primary first digit line contact section 404A-1 and an individual secondary first digit line contact section 404A-2 includes odd SA devices, a group of the digit line routing and contact structures 420 within the horizontal area of the primary first digit line contact section 404A-1 may be coupled to a group of the digit lines 214 (FIG. 2) employed as odd base digit lines; and an additional group of the digit line routing and contact structures 420 within the horizontal area of an individual secondary first digit line contact section 404A-2 may be coupled to an additional group of the digit lines 214 (FIG. 2) employed as odd complementary digit lines; or vice versa. As another non-limiting example, if an individual first SA section 410A horizontally interposed between an individual primary first digit line contact section 404A-1 and an individual secondary first digit line contact section 404A-2 includes even SA devices, a group of the digit line routing and contact structures 420 within the horizontal area of the primary first digit line contact section 404A-1 may be coupled to a group of the digit lines 214 (FIG. 2) employed as so-called even base digit lines; and an additional group of the digit line routing and contact structures 420 within the horizontal area of an individual secondary first digit line contact section 404A-2 may be coupled to an additional group of the digit lines 214 (FIG. 2) employed as even complementary digit lines; or vice versa. For an individual SA device (e.g., an odd SA device, or an even SA device) within an individual first SA section 410A, digit line routing and contact structure(s) 420 from an individual primary first digit line contact section 404A-1 may be coupled to one end (in the Y-direction) of the SA device, and other digit line routing and contact structure(s) 420 from an individual secondary first digit line contact section 404A-2 may be coupled to another, opposite end (in the Y-direction) of the SA device.

Furthermore, in some embodiments, a further group of the digit line routing and contact structures 420 within a horizontal area of an individual primary second digit line contact section 404B-1 are coupled to a further group of the digit lines 214 (FIG. 2) employed as base digit lines (e.g., true digit lines); and another group of the digit line routing and contact structures 420 within a horizontal area of an individual secondary second digit line contact section 404B-2 are coupled to another group of the digit lines 214 (FIG. 2) employed as complementary digit lines (e.g., digit bar lines); or vice versa. As a non-limiting example, if an individual second SA section 410B horizontally interposed between an individual primary second digit line contact section 404B-1 and an individual secondary second digit line contact section 404B-2 includes odd SA devices, a further group of the digit line routing and contact structures 420 within the horizontal area of the primary second digit line contact section 404B-1 may be coupled to a further group of the digit lines 214 (FIG. 2) employed as odd base digit lines; and another group of the digit line routing and contact structures 420 within the horizontal area of an individual secondary second digit line contact section 404B-2 may be coupled to another group of the digit lines 214 (FIG. 2) employed as odd complementary digit lines; or vice versa. As another non-limiting example, if an individual second SA section 410B horizontally interposed between an individual primary second digit line contact section 404B-1 and an individual secondary second digit line contact section 404B-2 includes even SA devices, a further group of the digit line routing and contact structures 420 within the horizontal area of the primary second digit line contact section 404B-1 may be coupled to a further group of the digit lines 214 (FIG. 2) employed as so-called even base digit lines; and another group of the digit line routing and contact structures 420 within the horizontal area of an individual secondary second digit line contact section 404B-2 may be coupled to another group of the digit lines 214 (FIG. 2) employed as even complementary digit lines; or vice versa. For an individual SA device (e.g., an odd SA device, or an even SA device) within an individual second SA section 410B, digit line routing and contact structure(s) 420 from an individual primary second digit line contact section 404B-1 may be coupled to one end (in the Y-direction) of the SA device, and other digit line routing and contact structure(s) 420 from an individual secondary second digit line contact section 404B-2 may be coupled to another, opposite end (in the Y-direction) of the SA device.

Referring collectively to FIGS. 2 and 4, at least some of the digit line contact sections 404 of the control circuitry structure 400 may be horizontally offset, in the Y-direction, from individual digit line exit regions 204 of the memory array structure 200 most horizontally proximate thereto in the Y-direction. As a non-limiting example, for two (2) first digit line contact sections 404A (e.g., a primary first digit line contact section 404A-1 and a secondary first digit line contact section 404A-2) flanking (in the Y-direction) an individual first SA section 410A of the control circuitry structure 400, at least one (1) (e.g., each) of the first digit line contact sections 404A may be horizontally offset, in the Y-direction, from an individual first digit line exit subregion 204A most horizontally proximate thereto. In some embodiments, at least the secondary first digit line contact sections 404A-2 are individually horizontally offset, in the Y-direction, from the first digit line exit subregion 204A most horizontally proximate thereto. As another non-limiting example, for two (2) second digit line contact sections 404B (e.g., a primary second digit line contact section 404B-1 and a secondary second digit line contact section 404B-2) flanking (in the Y-direction) an individual second SA section 410B of the control circuitry structure 400, at least one (1) (e.g., each) of the second digit line contact sections 404B may be horizontally offset, in the Y-direction, from an individual second digit line exit subregion 204B most horizontally proximate thereto. In some embodiments, at least the secondary second digit line contact sections 404B-2 are individually horizontally offset, in the Y-direction, from the second digit line exit subregion 204B most horizontally proximate thereto. To account for the horizontal offset of the digit line contact sections 404 relative to the digit line exit regions 204, conductive routing structures may be vertically interposed between and coupled to the digit line routing and contact structures 420 within the digit line contact sections 404 and conductive contact structures (e.g., digit line contact structures) within the digit line exit regions 204. The conductive routing structures may horizontally extend, in the Y-direction, between the digit line routing and contact structures 420 and the conductive contact structures.

Other features (e.g., column decoder sections 412, MG sections 414, SWD sections 416, MWD sections 418, additional control circuitry regions 408) of the control circuitry structure 400 may be substantially similar to and may be arranged in a similar manner to respective features (e.g., the column decoder sections 312, the MG sections 314, the SWD sections 316, the MWD sections 318, the additional control circuitry regions 308) of the control circuitry structure 300 previously described herein with reference to FIG. 3.

FIG. 5 is a simplified, schematic view of a control circuitry structure 500, in accordance with additional embodiments of the disclosure. The control circuitry structure 500 may be included in place of the control circuitry structure 300 (FIG. 3) within the microelectronic device 100 (FIG. 1). The control circuitry structure 500 may vertically overlie the memory array structure 200 (FIG. 2). Similar to the control circuitry structure 300 (FIG. 3), the control circuitry structure 500 may be formed separate from the memory array structure 200 (FIG. 2), and may be subsequently attached to the memory array structure 200 (FIG. 2) to form an another embodiment of the microelectronic device 100 (FIG. 1) through a process substantially similar to that previously described herein with reference to FIG. 1. The control circuitry structure 500 may have some similarities with the control circuitry structure 300 (FIG. 3) but may have different configurations of some features (e.g., regions, sections, structures, circuitry, devices) thereof as compared to respective features of the control circuitry structure 300 (FIG. 3).

As shown in FIG. 5, the control circuitry structure 500 includes control circuitry regions 502, digit line contact sections 504 interposed between pairs of the control circuitry regions 502 horizontally neighboring one another in the Y-direction, and word line contact sections 506 interposed between additional pairs of the control circuitry regions 502 horizontally neighboring one another in the X-direction orthogonal to the Y-direction. The control circuitry structure 500 also includes SA sections 510 that individually horizontally overlap portions of individual pairs of control circuitry regions 502 horizontally neighboring one another in the Y-direction, as well as a portion of individual digit line contact sections 504 interposed between the pairs of control circuitry regions 502. In addition, the control circuitry structure 500 includes SWD sections 516 that individually horizontally overlap portions of individual additional pairs of control circuitry regions 502 horizontally neighboring one another in the X-direction, as well as a portion of individual word line contact sections 506 interposed between the additional pairs of control circuitry regions 502. The control circuitry regions 502, the digit line contact sections 504, the word line contact sections 506, the SA sections 510, and the SWD sections 516 are each described in further detail below.

The control circuitry regions 502 of the control circuitry structure 500 vertically overlie, at least partially (e.g., substantially) horizontally overlap, and are operatively associated with the array regions 202 (FIG. 2) of the memory array structure 200 (FIG. 2). For ease of understanding the drawings and related description, FIG. 5 illustrates the control circuitry structure 500 as including four (4) control circuitry regions 502: a first control circuitry region 502A, a second control circuitry region 502B, a third control circuitry region 502C, and a fourth control circuitry region 502D. However, the control circuitry structure 500 may include a different quantity of control circuitry regions 502. As shown in FIG. 5, the second control circuitry region 502B may horizontally neighbor the first control circuitry region 502A in the Y-direction, and may horizontally neighbor the fourth control circuitry region 502D in the X-direction; the third control circuitry region 502C may horizontally neighbor the first control circuitry region 502A in the X-direction, and may horizontally neighbor the fourth control circuitry region 502D in the Y-direction; and the fourth control circuitry region 502D may horizontally neighbor the third control circuitry region 502C in the Y-direction, and may horizontally neighbor the second control circuitry region 502B in the X-direction. The first control circuitry region 502A may at least partially (e.g., substantially) horizontally overlap the first array region 202A (FIG. 2) of the memory array structure 200 (FIG. 2); the second control circuitry region 502B may at least partially (e.g., substantially) horizontally overlap the second array region 202B of the memory array structure 200 (FIG. 2); the third control circuitry region 502C may at least partially (e.g., substantially) horizontally overlap the third array region 202C (FIG. 2) of the memory array structure 200 (FIG. 2); and the fourth control circuitry region 502D may at least partially (e.g., substantially) horizontally overlap the fourth array region 202D (FIG. 2) of the memory array structure 200 (FIG. 2).

The digit line contact sections 504 of the control circuitry structure 500 vertically overlie, at least partially (e.g., substantially) horizontally overlap, and are operatively associated with the digit line exit regions 204 (FIG. 2) of the memory array structure 200 (FIG. 2). In some embodiments, a horizontal center, in the Y-direction, of an individual digit line contact section 504 of the control circuitry structure 500 is substantially aligned with a horizontal center, in the Y-direction, of an individual digit line exit region 204 (FIG. 2) of the memory array structure 200 (FIG. 2) thereunder. The digit line contact sections 504 of the control circuitry structure 500 may substantially linearly extend in the X-direction; and may be horizontally interposed, in the Y-direction, between control circuitry regions 502 horizontally neighboring one another in the Y-direction.

The word line contact sections 506 of the control circuitry structure 500 vertically overlie, at least partially (e.g., substantially) horizontally overlap, and are operatively associated with the word line exit regions 206 (FIG. 2) of the memory array structure 200 (FIG. 2). In some embodiments, a horizontal center, in the X-direction, of an individual word line contact section 506 of the control circuitry structure 500 is substantially aligned with a horizontal center, in the X-direction, of an individual word line exit region 206 (FIG. 2) of the memory array structure 200 (FIG. 2) thereunder. The word line contact sections 506 of the control circuitry structure 500 may substantially linearly extend in the Y-direction; and may be horizontally interposed, in the X-direction, between control circuitry regions 502 horizontally neighboring one another in the X-direction.

Still referring to FIG. 5, for an individual pair (e.g., two) of the control circuitry regions 502 horizontally neighboring one another in the Y-direction and substantially horizontally aligned with one another in the X-direction (e.g., the first control circuitry region 502A and the second control circuitry region 502B, the third control circuitry region 502C and the fourth control circuitry region 502D), an individual SA section 510 of the control circuitry structure 500 may horizontally overlap and at least partially define neighboring corner portions of the pair of the control circuitry regions 502. A first SA sub-section 510A of the SA section 510 may be positioned within the horizontal area of one control circuitry region 502 of the pair of the control circuitry regions 502; and a second SA sub-section 510B of the SA section 510 may be positioned within the horizontal area of the other control circuitry region 502 of the pair of the control circuitry regions 502. As a non-limiting example, an individual the SA section 510 may horizontally overlap and at least partially define neighboring corner portions of the first control circuitry region 502A and the second control circuitry region 502B, and may include a first SA sub-section 510A within the first control circuitry region 502A and a second SA sub-section 510B within the second control circuitry region 502B. In addition, for an individual SA section 510, a portion of the first SA sub-section 510A thereof and a portion of the second SA sub-section 510B may horizontally overlap and an individual digit line contact section 504 horizontally interposed between the pair of the control circuitry regions 502 operatively associated with the SA section 510. For example, for an individual SA section 510 operatively associated with the first control circuitry region 502A and the second control circuitry region 502B, the first control circuitry region 502A thereof may horizontally extend in the Y-direction from a horizontal area of the first control circuitry region 502A and partially into a horizontally area of the digit line contact section 504 interposed between the first control circuitry region 502A and the second control circuitry region 502B; and the second control circuitry region 502B thereof may horizontally extend in the Y-direction from a horizontal area of the second control circuitry region 502B and partially into the horizontally area of the digit line contact section 504.

For an individual pair of the control circuitry regions 502 horizontally neighboring one another in the Y-direction and substantially horizontally aligned with one another in the X-direction (e.g., the first control circuitry region 502A and the second control circuitry region 502B, the third control circuitry region 502C and the fourth control circuitry region 502D), at least one (1) of the SA sections 510 operatively associated with the pair of the control circuitry regions 502 may be horizontally offset, in the X-direction, from at least two (2) other of the SA sections 510 operatively associated with the pair of the control circuitry regions 502. The least one (1) of the SA sections 510 may be horizontally interposed, in the Y-direction, between the at least two (2) other of the SA sections 510. In addition, the at least two (2) other of the SA sections 510 may be substantially horizontally aligned with one another in the X-direction. By way of non-limiting example, for the first control circuitry region 502A and the second control circuitry region 502B, one (1) SA section 510 horizontally overlapping and partially defin- ing each of the first control circuitry region 502A and the second control circuitry region 502B may be horizontally offset, in the X-direction, from each of one (1) other SA section 510 positioned at or proximate a diagonally oppos- ing corner of the first control circuitry region 502A and one (1) further SA section 510 positioned at or proximate a diagonally opposing corner of the second control circuitry region 502B.

For an individual pair of the control circuitry regions 502 horizontally neighboring one another in the X-direction and substantially horizontally aligned with one another in the Y-direction (e.g., the first control circuitry region 502A and the third control circuitry region 502C, the second control circuitry region 502B and the fourth control circuitry region 502D), two (2) of the of the SA sections 510 operatively associated with the pair of the control circuitry regions 502 may be substantially aligned with one another in the Y-di- rection, and two (2) other of the SA sections 510 operatively associated with the pair of the control circuitry regions 502 may be substantially aligned with one another in the Y-di- rection and may be substantially horizontally offset from the two (2) of the of the SA sections 510 in each of the Y-direction and the X-direction. A horizontal distance in the X-direction between two (2) of the SA sections 510 may be different (e.g., greater than, less than) another horizontal distance in the X-direction between the two (2) other of the of the SA sections 510. By way of non-limiting example, for the first control circuitry region 502A and the third control circuitry region 502C, two (2) SA sections 510 operatively associated therewith may be substantially horizontally aligned with one another in the Y-direction and may be spaced apart from another in the X-direction by a first distance; and two (2) other SA sections 510 operatively associated therewith may be horizontally offset from the two (2) SA sections 510 in the Y-direction, may be substantially horizontally aligned with one another in the Y-direction, and may be spaced apart from another in the X-direction by a second distance less than the first distance.

As shown in FIG. 5, an individual control circuitry region 502 (e.g., the first control circuitry region 502A, the second control circuitry region 502B, the third control circuitry region 502C, or the fourth control circuitry region 502D) may include portions of two (2) SA sections 510 within a horizontal area thereof. The control circuitry region 502 may include a first SA sub-section 510A of one (1) of the two (2) SA sections 510 positioned at or proximate one corner of the control circuitry region 502, and a second SA sub-section 510B of another one (1) of the two (2) SA sections 510 positioned at or proximate another corner of the control circuitry region 502 diagonally opposing the corner of the control circuitry region 502.

Within an individual SA section 510, the first SA sub- section 510A may include even SA devices (but not odd SA devices) and the second SA sub-section 510B may include odd SA devices (but not even SA devices), or vice versa. According, the odd SA devices of the SA section 510 may be located within a different control circuitry region 502 than the even SA devices of the SA section 510. As a non-limiting example, for an individual SA section 510 horizontally overlapping and partially defining each of the first control circuitry region 502A and the second control circuitry region 502B, the first SA sub-section 510A thereof may be posi- tioned at least partially within the first control circuitry region 502A and may include even SA devices, and the second SA sub-section 510B thereof may be positioned at least partially within the second control circuitry region 502B and may include odd SA devices. In some embodi- ments, each first SA sub-section 510A of each SA section 510 includes even SA devices, and each second SA sub- section 510B of each SA section 510 includes odd SA devices. In additional embodiments, each first SA sub- section 510A of each SA section 510 includes odd SA devices, and each second SA sub-section 510B of each SA section 510 includes even SA devices.

The SA devices (e.g., odd SA devices, even SA devices) within an individual SA section 510 may be coupled to digit lines 214 (FIG. 2) (e.g., odd digit lines, even digit lines) horizontally extending through an individual control cir- cuitry region 502, and may also be coupled to additional digit lines 214 (FIG. 2) (e.g., additional odd digit lines, additional even digit lines) horizontally extending through another control circuitry region 502 horizontally neighboring the control circuitry region 502 in the Y-direction and substantially horizontally aligned with the control circuitry region 502 in the X-direction. For example, if the first SA sub-section 510A of an individual SA section 510 horizontally overlapping and partially defining each of the first control circuitry region 502A and the second control circuitry region 502B includes even SA devices, a portion of the even SA devices may be coupled to even digit lines 214 (FIG. 2) horizontally extending through the first control circuitry region 502A, and another portion of the even SA devices may be coupled to additional even digit lines 214 (FIG. 2) horizontally extending through the second control circuitry region 502B. The even SA devices of the first SA sub-section 510A may be so coupled to even digit lines 214 (FIG. 2) of the memory array structure 200 (FIG. 2) by way of even digit line routing and contact structures 520A positioned within a portion of the digit line contact section 504 horizontally overlapping the SA section 510. As another example, if the second SA sub-section 510B of an individual SA section 510 horizontally overlapping and partially defining each of the first control circuitry region 502A and the second control circuitry region 502B includes odd SA devices, a portion of the odd SA devices may be coupled to odd digit lines 214 (FIG. 2) horizontally extending through the first control circuitry region 502A, and another portion of the odd SA devices may be coupled to additional odd digit lines 214 (FIG. 2) horizontally extending through the second control circuitry region 502B. The odd SA devices of the second SA sub-section 510B may be so coupled to odd digit lines 214 (FIG. 2) of the memory array structure 200 (FIG. 2) by way of odd digit line routing and contact structures 520B positioned within the portion of the digit line contact section 504 horizontally overlapping the SA section 510. The even digit line routing and contact structures 520A and the odd digit line routing and contact structures 520B of the control circuitry structure 500 may collectively be referred to as digit line routing and contact structures 520 of the control circuitry structure 500.

Still referring to FIG. 5, for an individual pair of the control circuitry regions 502 horizontally neighboring one another in the X-direction and substantially horizontally aligned with one another in the Y-direction (e.g., the first control circuitry region 502A and the third control circuitry region 502C, the second control circuitry region 502B and the fourth control circuitry region 502D), an individual SWD section 516 of the control circuitry structure 500 may horizontally overlap and at least partially define neighboring corner portions of the pair of the control circuitry regions 502. A first SWD sub-section 516A of the SWD section 516 may be positioned within the horizontal area of one control circuitry region 502 of the pair of the control circuitry regions 502; and a second SWD sub-section 516B of the SWD section 516 may be positioned within the horizontal area of the other control circuitry region 502 of the pair of the control circuitry regions 502. As a non-limiting example, an individual SWD section 516 may horizontally overlap and at least partially define neighboring corner portions of the first control circuitry region 502A and the third control circuitry region 502C, and may include a first SWD sub-section 516A within the first control circuitry region 502A and a second SWD sub-section 516B within the third control circuitry region 502C. In addition, for an individual SWD section 516, a portion of the first SWD sub-section 516A thereof and a portion of the second SWD sub-section 516B may horizontally overlap and an individual word line contact section 506 horizontally interposed between the pair of the control circuitry regions 502 operatively associated with the SWD section 516. For example, for an individual SWD section 516 operatively associated with the first control circuitry region 502A and the third control circuitry region 502C, the first control circuitry region 502A thereof may horizontally extend in the X-direction from a horizontal area of the first control circuitry region 502A and partially into a horizontally area of the word line contact section 506 interposed between the first control circuitry region 502A and the third control circuitry region 502C; and the second control circuitry region 502B thereof may horizontally extend in the X-direction from a horizontal area of the third control circuitry region 502C and partially into the horizontally area of the word line contact section 506.

For an individual pair of the control circuitry regions 502 horizontally neighboring one another in the X-direction and substantially horizontally aligned with one another in the Y-direction (e.g., the first control circuitry region 502A and the third control circuitry region 502C, the second control circuitry region 502B and the fourth control circuitry region 502D), at least one (1) of the SWD sections 516 operatively associated with the pair of the control circuitry regions 502 may be horizontally offset, in the Y-direction, from at least two (2) other of the SWD sections 516 operatively associated with the pair of the control circuitry regions 502. The least one (1) of the SWD sections 516 may be horizontally interposed, in the X-direction, between the at least two (2) other of the SWD sections 516. In addition, the at least two (2) other of the SWD sections 516 may be substantially horizontally aligned with one another in the Y-direction. By way of non-limiting example, for the first control circuitry region 502A and the third control circuitry region 502C, one (1) SWD section 516 horizontally overlapping and partially defining each of the first control circuitry region 502A and the third control circuitry region 502C may be horizontally offset, in the Y-direction, from each of one (1) other SWD section 516 positioned at or proximate a diagonally opposing corner of the first control circuitry region 502A and one (1) further SWD section 516 positioned at or proximate a diagonally opposing corner of the third control circuitry region 502C.

For an individual pair of the control circuitry regions 502 horizontally neighboring one another in the Y-direction and substantially horizontally aligned with one another in the X-direction (e.g., the first control circuitry region 502A and the second control circuitry region 502B, the third control circuitry region 502C and the fourth control circuitry region 502D), two (2) of the of the SWD sections 516 operatively associated with the pair of the control circuitry regions 502 may be substantially aligned with one another in the X-direction, and two (2) other of the SWD sections 516 operatively associated with the pair of the control circuitry regions 502 may be substantially aligned with one another in the X-direction and may be substantially horizontally offset from the two (2) of the of the SWD sections 516 in each of the X-direction and the Y-direction. A horizontal distance in the Y-direction between two (2) of the SWD sections 516 may be different (e.g., greater than, less than) another horizontal distance in the Y-direction between the two (2) other of the of the SWD sections 516. By way of non-limiting example, for the first control circuitry region 502A and the second control circuitry region 502B, two (2) SWD sections 516 operatively associated therewith may be substantially horizontally aligned with one another in the X-direction and may be spaced apart from another in the Y-direction by a first distance; and two (2) other SWD sections 516 operatively associated therewith may be horizontally offset from the two (2) SWD sections 516 in the X-direction, may be substantially horizontally aligned with one another in the X-direction, and may be spaced apart from another in the Y-direction by a second distance less than the first distance.

As shown in FIG. 5, an individual control circuitry region 502 (e.g., the first control circuitry region 502A, the second control circuitry region 502B, the third control circuitry region 502C, or the fourth control circuitry region 502D) may include portions of two (2) SWD sections 516 within a horizontal area thereof. The control circuitry region 502 may include a first SWD sub-section 516A of one (1) of the two (2) SWD sections 516 positioned at or proximate one corner of the control circuitry region 502, and a second SWD sub-section 516B of another one (1) of the two (2) SWD sections 516 positioned at or proximate another corner of the control circuitry region 502 diagonally opposing the corner of the control circuitry region 502.

Within an individual SWD section 516, the first SWD sub-section 516A may include odd SWD devices (but not even SWD devices) and the second SWD sub-section 516B may include even SWD devices (but not odd SWD devices), or vice versa. Accordingly, the even SWD devices of the SWD section 516 may be located within a different control circuitry region 502 than the odd SWD devices of the SWD section 516. As a non-limiting example, for an individual SWD section 516 horizontally overlapping and partially defining each of the first control circuitry region 502A and the third control circuitry region 502C, the first SWD sub-section 516A thereof may be positioned at least partially within the first control circuitry region 502A and may include odd SWD devices, and the second SWD sub-section 516B thereof may be positioned at least partially within the third control circuitry region 502C and may include even SWD devices. In some embodiments, each first SWD sub-section 516A of each SWD section 516 includes odd SWD devices, and each second SWD sub-section 516B of each SWD section 516 includes even SWD devices. In additional embodiments, each first SWD sub-section 516A of each SWD section 516 includes even SWD devices, and each second SWD sub-section 516B of each SWD section 516 includes odd SWD devices.

The SWD devices (e.g., odd SWD devices, even SWD devices) within an individual SWD section 516 may be coupled to word lines 216 (FIG. 2) (e.g., odd word lines, even word lines) horizontally extending through an individual control circuitry region 502, and may also be coupled to additional word lines 216 (FIG. 2) (e.g., additional odd word lines, additional even word lines) horizontally extending through another control circuitry region 502 horizontally neighboring the control circuitry region 502 in the X-direction and substantially horizontally aligned with the control circuitry region 502 in the Y-direction. For example, if the first SWD sub-section 516A of an individual SWD section 516 horizontally overlapping and partially defining each of the first control circuitry region 502A and the third control circuitry region 502C includes odd SWD devices, a portion of the odd SWD devices may be coupled to odd word lines 216 (FIG. 2) horizontally extending through the first control circuitry region 502A, and another portion of the odd SWD devices may be coupled to additional odd word lines 216 (FIG. 2) horizontally extending through the third control circuitry region 502C. The odd SWD devices of the first SWD sub-section 516A may be so coupled to odd word lines 216 (FIG. 2) of the memory array structure 200 (FIG. 2) by way of odd word line routing and contact structures 522A positioned within a portion of the word line contact section 506 horizontally overlapping the SWD section 516. As another example, if the second SWD sub-section 516B of an individual SWD section 516 horizontally overlapping and partially defining each of the first control circuitry region 502A and the third control circuitry region 502C includes even SWD devices, a portion of the even SWD devices may be coupled to even word lines 216 (FIG. 2) horizontally extending through the first control circuitry region 502A, and another portion of the even SWD devices may be coupled to additional even word lines 216 (FIG. 2) horizontally extending through the third control circuitry region 502C. The even SWD devices of the second SWD sub-section 516B may be so coupled to even word lines 216 (FIG. 2) of the memory array structure 200 (FIG. 2) by way of even word line routing and contact structures 522B positioned within the portion of the word line contact section 506 horizontally overlapping the SWD section 516. The odd word line routing and contact structures 522A and the even word line routing and contact structures 522B of the control circuitry structure 500 may collectively be referred to as word line routing and contact structures 522 of the control circuitry structure 500.

The control circuitry structure 500 may further include features (e.g., column decoder sections, MG sections, MWD sections, additional control circuitry regions) substantially similar to respective features (e.g., the column decoder sections 312, the MG sections 314, the MWD sections 318, the additional control circuitry regions 308) of the control circuitry structure 300 previously described herein with reference to FIG. 3. Such features may be arranged relative to the SA sections 510 and the SWD section 516 in a manner similar to that previously described with respect to the SA sections 310 (FIG. 3) and the SWD section 316 (FIG. 3) of the control circuitry structure 300 (FIG. 3). For example, within the horizontal area of an individual control circuitry region 502, the control circuitry structure 500 may include column decoder sections inwardly horizontally neighboring the SA sections 510 in the Y-direction; MG sections inwardly horizontally neighboring the column decoder sections in the Y-direction; and MWD sections inwardly horizontally neighboring the SWD sections 516 in the X-direction. In addition, the control circuitry structure 500 may include one or more additional control circuitry regions horizontally neighboring some of the control circuitry regions 502 in one or more of the X-direction and the Y-direction.

FIG. 6 is a simplified, schematic view of a control circuitry structure 600, in accordance with additional embodiments of the disclosure. The control circuitry structure 600 may be included in place of the control circuitry structure 300 (FIG. 3) within the microelectronic device 100 (FIG. 1). The control circuitry structure 600 may vertically overlie the memory array structure 200 (FIG. 2). Similar to the control circuitry structure 300 (FIG. 3), the control circuitry structure 600 may be formed separate from the memory array structure 200 (FIG. 2), and may be subsequently attached to the memory array structure 200 (FIG. 2) to form an another embodiment of the microelectronic device 100 (FIG. 1) through a process substantially similar to that previously described herein with reference to FIG. 1. The control circuitry structure 600 may have some similarities with the control circuitry structure 300 (FIG. 3) but may have different configurations of some features (e.g., regions, sections, structures, circuitry, devices) thereof as compared to respective features of the control circuitry structure 300 (FIG. 3).

As shown in FIG. 6, the control circuitry structure 600 includes control circuitry regions 602, digit line contact sections 604 interposed between pairs of the control circuitry regions 602 horizontally neighboring one another in the Y-direction, and word line contact sections 606 interposed between pairs of the control circuitry regions 602 horizontally neighboring one another in the X-direction. The control circuitry structure 600 also includes SA sections 610 that individually horizontally overlap portions of individual groups of four (4) control circuitry regions 602 horizontally neighboring one another; and SWD sections 616 individually horizontally overlapping portions of individual additional groups of four (4) control circuitry regions 602 horizontally neighboring one another. In addition, the control circuitry structure 600 further includes read-write (RG) gap sections 624 within horizontal areas of the control circuitry regions 602 and horizontally neighboring SA sections 610 in the Y-direction; first MG sections 626 individually horizontally neighboring individual SA sections 610 in the X-direction; and second MG sections 628 individually horizontally neighboring individual SWD sections 616 in the Y-direction. The control circuitry regions 602, the digit line contact sections 604, the word line contact sections 606, the SA sections 610, the SWD sections 616, the RW gap sections, the first MG sections 626, and the second MG sections 628 are each described in further detail below.

The control circuitry regions 602 of the control circuitry structure 600 vertically overlie, at least partially (e.g., substantially) horizontally overlap, and are operatively associated with the array regions 202 (FIG. 2) of the memory array structure 200 (FIG. 2). For ease of understanding the drawings and related description, FIG. 6 illustrates the control circuitry structure 600 as including six (6) control circuitry regions 602: a first control circuitry region 602A, a second control circuitry region 602B, a third control circuitry region 602C, a fourth control circuitry region 602D, a fifth control circuitry region 602E, and a sixth control circuitry region 602F. However, the control circuitry structure 600 may include a different quantity of control circuitry regions 602. As shown in FIG. 6, the second control circuitry region 602B may be horizontally interposed between the first control circuitry region 602A and the fifth control circuitry region 602E in the X-direction and may be substantially aligned with the first control circuitry region 602A and the fifth control circuitry region 602E in the Y-direction; and the fourth control circuitry region 602D may be horizontally interposed between the second control circuitry region 602B and the sixth control circuitry region 602F in the X-direction and may be substantially aligned with the second control circuitry region 602B and the sixth control circuitry region 602F in the Y-direction. The first control circuitry region 602A may be substantially aligned with the second control circuitry region 602B in the X-direction; the third control circuitry region 602C may be substantially aligned with the fourth control circuitry region 602D in the X-direction; the fifth control circuitry region 602E may be substantially aligned with the sixth control circuitry region 602F in the X-direction. The first control circuitry region 602A may at least partially (e.g., substantially) horizontally overlap the first array region 202A (FIG. 2) of the memory array structure 200 (FIG. 2); the second control circuitry region 602B may at least partially (e.g., substantially) horizontally overlap the second array region 202B of the memory array structure 200 (FIG. 2); the third control circuitry region

602C may at least partially (e.g., substantially) horizontally overlap the third array region 202C (FIG. 2) of the memory array structure 200 (FIG. 2); the fourth control circuitry region 602D may at least partially (e.g., substantially) horizontally overlap the fourth array region 202D (FIG. 2) of the memory array structure 200 (FIG. 2); the fifth control circuitry region 602E may at least partially (e.g., substantially) horizontally overlap a fifth array region of the memory array structure 200 (FIG. 2); and the sixth control circuitry region 602F may at least partially (e.g., substantially) horizontally overlap a sixth array region of the memory array structure 200 (FIG. 2).

The digit line contact sections 604 of the control circuitry structure 600 may be operatively associated with the digit line exit regions 204 (FIG. 2) of the memory array structure 200 (FIG. 2). The digit line contact sections 604 may individually include digit routing and contact structures 620 in electrical communication with respective digit lines 214 (FIG. 2) of the memory array structure 200 (FIG. 2) terminating within respective digit line exit regions 204 (FIG. 2) of the memory array structure 200 (FIG. 2). The digit line routing and contact structures 620 may, for example, be coupled to conductive contact structures within the digit line exit regions 204 (FIG. 2) and coupled to the digit lines 214 (FIG. 2). The digit line routing and contact structures 620 may couple the digit lines 214 (FIG. 2) of the memory array structure 200 (FIG. 2) to SA devices within the SA sections 610 of the control circuitry structure 600, as described in further detail below.

Referring collectively to FIGS. 2 and 6, in some embodiments, digit line contact sections 604 of the control circuitry structure 600 at least partially (e.g., substantially) horizontally overlap digit line exit regions 204 of the memory array structure 200 thereunder. A horizontal center, in the Y-direction, of an individual digit line contact section 604 of the control circuitry structure 600 may be substantially aligned with a horizontal center, in the Y-direction, of an individual digit line exit region 204 of the memory array structure 200 thereunder. The digit line contact sections 604 may substantially linearly extend in the X-direction; and may be horizontally interposed, in the Y-direction, between control circuitry regions 602 horizontally neighboring one another in the Y-direction. In additional embodiments, the digit line contact sections 604 are positioned within horizontal areas of the control circuitry regions 602. In such embodiments, the digit line contact sections 604 of the control circuitry structure 600 are at least partially horizontally offset, in the Y-direction, from individual digit line exit regions 204 of the memory array structure 200 most horizontally proximate thereto in the Y-direction. For example, an individual digit line contact section 604 may be horizontally offset, in the Y-direction, from an individual digit line exit region 204 most horizontally proximate thereto. To account for the horizontal offset of the digit line contact sections 604 relative to the digit line exit regions 204, conductive routing structures may be vertically interposed between and coupled to the digit line routing and contact structures 620 within the digit line contact sections 604 and conductive contact structures (e.g., digit line contact structures) within the digit line exit regions 204. The conductive routing structures may horizontally extend, in the Y-direction, between the digit line routing and contact structures 620 and the conductive contact structures.

Referring to FIG. 6, the word line contact sections 606 of the control circuitry structure 600 may be operatively associated with the word line exit regions 206 (FIG. 2) of the memory array structure 200 (FIG. 2). The word line contact sections 606 may individually include word line routing and contact structures 622 in electrical communication with respective word lines 216 (FIG. 2) of the memory array structure 200 (FIG. 2) terminating within respective word line exit regions 206 (FIG. 2) of the memory array structure 200 (FIG. 2). The word line routing and contact structures 622 may, for example, be coupled to conductive contact structures within the word line exit regions 206 (FIG. 2) and coupled to the word lines 216 (FIG. 2). The word line routing and contact structures 622 may couple the word lines 216 (FIG. 2) of the memory array structure 200 (FIG. 2) to SWD devices within the SWD sections 616 of the control circuitry structure 600, as described in further detail below.

Referring collectively to FIGS. 2 and 6, in some embodiments, word line contact sections 606 of the control circuitry structure 600 at least partially (e.g., substantially) horizontally overlap word line exit regions 206 of the memory array structure 200 thereunder. A horizontal center, in the X-direction, of an individual word line contact section 606 of the control circuitry structure 600 may be substantially aligned with a horizontal center, in the X-direction, of an individual word line exit region 206 of the memory array structure 200 thereunder. The word line contact sections 606 may substantially linearly extend in the Y-direction; and may be horizontally interposed, in the X-direction, between control circuitry regions 602 horizontally neighboring one another in the X-direction. In additional embodiments, the word line contact sections 606 are positioned within horizontal areas of the control circuitry regions 602. In such embodiments, the word line contact sections 606 of the control circuitry structure 600 are at least partially horizontally offset, in the X-direction, from individual word line exit regions 206 of the memory array structure 200 most horizontally proximate thereto in the X-direction. For example, an individual word line contact section 606 may be horizontally offset, in the X-direction, from an individual word line exit region 206 most horizontally proximate thereto. To account for the horizontal offset of the word line contact sections 606 relative to the word line exit regions 206, conductive routing structures may be vertically interposed between and coupled to the word line routing and contact structures 622 within the word line contact sections 606 and conductive contact structures (e.g., word line contact structures) within the word line exit regions 206. The conductive routing structures may horizontally extend, in the X-direction, between the word line routing and contact structures 622 and the conductive contact structures.

Referring again FIG. 6, for an individual group of four (4) of the control circuitry regions 602 horizontally neighboring one another, an individual SA section 610 of the control circuitry structure 600 may horizontally overlap and at least partially define neighboring corner portions of the group of four (4) of the control circuitry regions 602. As a non-limiting example, an individual the SA section 610 may horizontally overlap and at least partially define neighboring corner portions of the third control circuitry region 602C, the fourth control circuitry region 602D, the fifth control circuitry region 602E, and the sixth control circuitry region 602F. The SA section 610 operatively associated with the group of four (4) of the control circuitry regions 602 may be horizontally offset, in the Y-direction, from at least four (4) other of the SA sections 610 horizontally neighboring the SA section 610. The SA section 610 may be horizontally interposed, in the X-direction and the Y-direction, between the at least four (4) other of the SA sections 610. In addition, at least two (2) of the at least four (4) other of the SA sections 610 may be substantially horizontally aligned with one another in the Y-direction; and at least two (2) other of the at least four (4) other of the SA sections 610 may be offset from the at least two (2) of the at least four (4) other of the SA sections 610 in the Y-direction and substantially horizontally aligned with one another in the Y-direction. By way of non-limiting example, for the group of four (4) the SA sections 610 including the third control circuitry region 602C, the fourth control circuitry region 602D, the fifth control circuitry region 602E, and the sixth control circuitry region 602F, one (1) SA section 610 horizontally overlapping and partially defining each of the third control circuitry region 602C, the fourth control circuitry region 602D, the fifth control circuitry region 602E, and the sixth control circuitry region 602F may be horizontally offset, in each of the X-direction and the Y-direction, from each of four (4) other SA sections 610 respectively positioned at or proximate diagonally opposing corners of the third control circuitry region 602C, the fourth control circuitry region 602D, the fifth control circuitry region 602E, and the sixth control circuitry region 602F.

The SA sections 610 of the control circuitry structure 600 may include first SA sections 610A and second SA sections 610B. An individual control circuitry region 602 may include portions of two (2) of the SA sections 610 within a horizontal area thereof. For example, an individual control circuitry region 602 may include portions of one (1) first SA section 610A and one (1) second SA section 610B within the horizontal area thereof. For an individual control circuitry region 602, a first SA section 610A may be positioned at or proximate one corner of the control circuitry region 602, and a second SA section 610B may be positioned at or proximate another corner of the control circuitry region 602 diagonally opposing the corner. The first SA section 610A may horizontally overlap and partially define each of the control circuitry region 602 and an additional three (3) control circuitry regions 602 horizontally neighboring the control circuitry region 602; and the second SA section 610B may horizontally overlap and partially define each of the control circuitry region 602 and a further three (3) control circuitry regions 602 horizontally neighboring the control circuitry region 602.

For an individual control circuitry region 602, the first SA section 610A and the second SA section 610B within a horizontal area thereof may each include odd SA devices (but not even SA devices); the first SA section 610A and the second SA section 610B within the horizontal area thereof may each include even SA devices (but not odd SA devices); or the first SA section 610A within the horizontal area thereof may include one of odd SA devices and even SA devices, and the second SA section 610B within the horizontal area thereof may include the other of odd SA devices and even SA devices. However, an individual pair of SA sections 610 substantially horizontally aligned with one another in the X-direction may include one SA section 610 including odd SA devices and another SA section 610 including even SA devices. For example, one second SA section 610B horizontally overlapping each control circuitry region 602 of a group of the four (4) control circuitry regions 602 (e.g., the first control circuitry region 602A, the third control circuitry region 602C, and two additional control circuitry regions 602) may include odd SA devices; and another second SA section 610B substantially horizontally aligned with the one second SA section 610B in the X-direction and horizontally overlapping each control circuitry region 602 of another group of the four (4) control circuitry regions 602 (e.g., the second control circuitry region 602B, the fourth control circuitry region 602D, and two further control circuitry regions 602) may include even SA devices. As another example, one first SA section 610A horizontally overlapping each control circuitry region 602 of an another group of the four (4) control circuitry regions 602 (e.g., third control circuitry region 602C, the fourth control circuitry region 602D, the fifth control circuitry region 602E, and the sixth control circuitry region 602F) may include odd SA devices; and another first SA section 610A substantially horizontally aligned with the one first SA section 610A in the X-direction and horizontally overlapping each control circuitry region 602 of yet another group of the four (4) control circuitry regions 602 may include even SA devices.

The SA devices (e.g., odd SA devices, even SA devices) within an individual SA section 610 may be coupled to digit lines 214 (FIG. 2) (e.g., odd word lines, even word lines) horizontally extending through at least two control circuitry regions 602, and may also be coupled to additional digit lines 214 (FIG. 2) (e.g., additional odd word lines, additional even word lines) horizontally extending through at least two other control circuitry regions 602 substantially horizontally aligned with the at least two control circuitry regions 602 in the X-direction. For example, if the first SA section 610A horizontally overlapping and partially defining each of the third control circuitry region 602C and the fourth control circuitry region 602D includes odd SA devices, a portion of the odd SA devices may be coupled to odd digit lines 214 (FIG. 2) horizontally extending through the third control circuitry region 602C and another control circuitry region 602 horizontally neighboring the third control circuitry region 602C in the Y-direction, and another portion of the odd SA devices may be coupled to additional odd digit lines 214 (FIG. 2) horizontally extending through the fourth control circuitry region 602D and a further control circuitry region 602 horizontally neighboring the fourth control circuitry region 602D in the Y-direction. The odd SA devices of the first SA section 610A may be so coupled to odd digit lines 214 (FIG. 2) of the memory array structure 200 (FIG. 2) by way of digit line routing and contact structures 620 positioned within a portion of the digit line contact section 604 horizontally interposed between the third control circuitry region 602C and the fourth control circuitry region 602D.

Still referring to FIG. 6, for an individual additional group of four (4) of the control circuitry regions 602 horizontally neighboring one another, an individual SWD section 616 of the control circuitry structure 600 may horizontally overlap and at least partially define neighboring corner portions of the additional group of four (4) of the control circuitry regions 602. As a non-limiting example, an individual SWD section 616 may horizontally overlap and at least partially define neighboring corner portions of the first control circuitry region 602A, the second control circuitry region 602B, the third control circuitry region 602C, and the fourth control circuitry region 602D. The SWD section 616 operatively associated with the additional group of four (4) of the control circuitry regions 602 may be horizontally offset, in the Y-direction, from at least four (4) other of the SWD sections 616 horizontally neighboring the SWD section 616. The SWD section 616 may be horizontally interposed, in the X-direction and the Y-direction, between the at least four (4) other of the SWD sections 616. In addition, at least two (2) of the at least four (4) other of the SWD sections 616 may be substantially horizontally aligned with one another in the Y-direction; and at least two (2) other of the at least four (4) other of the SWD sections 616 may be offset from the at least two (2) of the at least four (4) other of the SWD sections 616 in the Y-direction and substantially horizontally aligned with one another in the Y-direction. By way of non-limiting example, for the additional group of four (4) the SWD sections 616 including the first control circuitry region 602A, the second control circuitry region 602B, the third control circuitry region 602C, and the fourth control circuitry region 602D, one (1) SWD section 616 horizontally overlapping and partially defining each of the first control circuitry region 602A, the second control circuitry region 602B, the third control circuitry region 602C, and the fourth control circuitry region 602D may be horizontally offset, in each of the X-direction and the Y-direction, from each of four (4) other SWD sections 616 respectively positioned at or proximate diagonally opposing corners of the first control circuitry region 602A, the second control circuitry region 602B, the third control circuitry region 602C, and the fourth control circuitry region 602D.

The SWD sections 616 of the control circuitry structure 600 may include first SWD sections 616A and second SWD sections 616B. An individual control circuitry region 602 may include portions of two (2) of the SWD sections 616 within a horizontal area thereof. For example, an individual control circuitry region 602 may include portions of one (1) first SWD section 616A and one (1) second SWD section 616B within the horizontal area thereof. For an individual control circuitry region 602, a first SWD section 616A may be positioned at or proximate one corner of the control circuitry region 602, and a second SWD section 616B may be positioned at or proximate another corner of the control circuitry region 602 diagonally opposing the corner. The first SWD section 616A may horizontally overlap and partially define each of the control circuitry region 602 and an additional three (3) control circuitry regions 602 horizontally neighboring the control circuitry region 602; and the second SWD section 616B may horizontally overlap and partially define each of the control circuitry region 602 and a further three (3) control circuitry regions 602 horizontally neighboring the control circuitry region 602.

For an individual control circuitry region 602, the first SWD section 616A and the second SWD section 616B within a horizontal area thereof may each include odd SWD devices (but not even SWD devices); the first SWD section 616A and the second SWD section 616B within the horizontal area thereof may each include even SWD devices (but not odd SWD devices); or the first SWD section 616A within the horizontal area thereof may include one of odd SWD devices and even SWD devices, and the second SWD section 616B within the horizontal area thereof may include the other of odd SWD devices and even SWD devices. However, an individual pair of SWD sections 616 substantially horizontally aligned with one another in the Y-direction may include one SWD section 616 including odd SWD devices and another SWD section 616 including even SWD devices. For example, one first SWD section 616A horizontally overlapping each control circuitry region 602 of a group of the four (4) control circuitry regions 602 (e.g., first control circuitry region 602A, the second control circuitry region 602B, the third control circuitry region 602C, and the fourth control circuitry region 602D) may include odd SWD devices; and another first SWD section 616A substantially horizontally aligned with the one first SWD section 616A in the Y-direction and horizontally overlapping each control circuitry region 602 of another group of the four (4) control circuitry regions 602 (e.g., the fifth control circuitry region 602E, the sixth control circuitry region 602F, and two additional control circuitry regions 602) may include even SWD devices. As another example, one second SWD section 616B horizontally overlapping each control circuitry region 602 of an additional group of the four (4) control circuitry regions 602 may include odd SWD devices; and another second SWD section 616B substantially horizontally aligned with the one second SWD section 616B in the Y-direction and horizontally overlapping each control circuitry region 602 of another group of the four (4) control circuitry regions 602 may include even SWD devices.

The SWD devices (e.g., odd SWD devices, even SWD devices) within an individual SWD section 616 may be coupled to word lines 216 (FIG. 2) (e.g., odd word lines, even word lines) horizontally extending through at least two control circuitry regions 602, and may also be coupled to additional word lines 216 (FIG. 2) (e.g., additional odd word lines, additional even word lines) horizontally extending through at least two other control circuitry regions 602 substantially horizontally aligned with the at least two control circuitry regions 602 in the Y-direction. For example, if the first SWD section 616A horizontally overlapping and partially defining each of the first control circuitry region 602A and the third control circuitry region 602C includes odd SWD devices, a portion of the odd SWD devices may be coupled to odd word lines 216 (FIG. 2) horizontally extending through the third control circuitry region 602C and the fifth control circuitry region 602E, and another portion of the odd SWD devices may be coupled to additional odd word lines 216 (FIG. 2) horizontally extending through the first control circuitry region 602A and another control circuitry region 602 horizontally neighboring the first control circuitry region 602A in the X-direction. The odd SWD devices of the first SWD section 616A may be so coupled to odd word lines 216 (FIG. 2) of the memory array structure 200 (FIG. 2) by way of word line routing and contact structures 622 positioned within a portion of the word line contact section 606 horizontally interposed between the first control circuitry region 602A and the second control circuitry region 602B. As another example, if the first SWD section 616A horizontally overlapping and partially defining each of the fifth control circuitry region 602E and a further control circuitry region 602 horizontally neighboring the fifth control circuitry region 602E in the X-direction includes even SWD devices, a portion of the even SWD devices may be coupled to even word lines 216 (FIG. 2) horizontally extending through the third control circuitry region 602C and the fifth control circuitry region 602E, and another portion of the even SWD devices may be coupled to additional even word lines 216 (FIG. 2) horizontally extending through the further control circuitry region 602 and an additional control circuitry region 602 horizontally neighboring the further control circuitry region 602 in the X-direction. The even SWD devices of the first SWD section 616A may be so coupled to even word lines 216 (FIG. 2) of the memory array structure 200 (FIG. 2) by way of word line routing and contact structures 622 positioned within a portion of the word line contact section 606 horizontally interposed between the fifth control circuitry region 602E and the further control circuitry region 602.

The RW gap sections 624 of the control circuitry structure 600 may be positioned within horizontal areas of the control circuitry regions 602. The RW gap sections 624 may include RW gate structures for RW devices of the control circuitry structure 600. Within an individual control circuitry region 602, an individual RW gap section 624 may horizontally neighbor, in the Y-direction, a portion of an individual SA section 610 within the horizontal area of the control circuitry region 602. In some embodiments, only one (1) RW gap section 624 is included within the horizontal area of an individual control circuitry region 602. For example, if an individual control circuitry region 602 includes two (2) SA sections 610 within a horizontal area thereof (as described in further detail below), only one (1) of the two (2) SA sections 610 may include a RW gap section 624 horizontally adjacent thereto in the Y-direction. In additional embodiments, multiple RW gap sections 624 are included within the horizontal area of an individual control circuitry region 602. For example, if an individual control circuitry region 602 includes two (2) SA sections 610 within a horizontal area thereof, each of the two (2) SA sections 610 may include a respective RW gap section 624 horizontally adjacent thereto in the Y-direction.

The first MG sections 626 of the control circuitry structure 600 may horizontally neighbor respective SA sections 610 in the X-direction; and the second MG sections 628 may horizontally neighbor respective SWD sections 616 in the Y-direction. The first MG sections 626 and the second MG sections 628 may individually include different conductive routing structures (e.g., control signal routing structures, column select routing structures, LIO routing structures, bussing routing structures) of the microelectronic device 100 (FIG. 1) within horizontal areas thereof. The conductive routing structures within an individual first MG section 626 or an individual second MG section 628 may individually horizontally extend (e.g., in the X-direction, in the Y-direction) through the first MG section 626 or the second MG section 628 en route to various control circuitry and devices of the control circuitry structure 600. Different conductive routing structures within horizontal areas of the first MG sections 626 and the second MG sections 628 may be positioned at different vertical elevations (e.g., in the Z-direction) than one another. The first MG sections 626 may be considered SA MG sections local to the SA sections 610 and individually employed for conductive routing structures operatively associated with the SA circuitry of a respective SA section 610. The second MG sections 628 may be considered SWD MG sections local to the SWG sections 616 and individually employed for additional conductive routing structures operatively associated with the SWD circuitry of a respective SWD section 616. The first MG sections 626 and the second MG sections 628 permit the SA sections 610 and the SWG sections 616 to horizontally overlap, in a halfway quilt arrangement, rather than a full quilt arrangement wherein an individual MG section is positioned horizontally adjacent (e.g., at horizontal corners of) and is shared by each of a respective SA section and a respective SWD section. The configurations of the first MG sections 626 and the second MG sections 628 may reduce routing congestion within respective horizontal areas thereof as compared to configurations wherein an individual MG gap is shared by each of a respective SA section and a respective SWD section.

The control circuitry structure 600 may further include features (e.g., column decoder sections, MWD sections, additional control circuitry regions) substantially similar to respective features (e.g., the column decoder sections 312, the MWD sections 318, the additional control circuitry regions 308) of the control circuitry structure 300 previously described herein with reference to FIG. 3. Such features may be arranged relative to the SA sections 610 and the SWD section 616 in a manner similar to that previously described with respect to the SA sections 310 (FIG. 3) and the SWD section 316 (FIG. 3) of the control circuitry structure 300 (FIG. 3). For example, within the horizontal area of an individual control circuitry region 602, the control circuitry structure 600 may include column decoder sections inwardly horizontally neighboring the SA sections 610 in the Y-direction; and MWD sections inwardly horizontally neighboring the SWD sections 616 in the X-direction. In addition, the control circuitry structure 600 may include one or more additional control circuitry regions horizontally neighboring some of the control circuitry regions 602 in one or more of the X-direction and the Y-direction.

Still referring to FIG. 6, various conductive routing schemes may be employed to operatively associate control circuitry within the control circuitry regions 602 of the control circuitry structure 600 with the digit lines 214 (FIG. 2) (and, hence, the memory cells 218 (FIG. 2)) within the memory array structure 200 (FIG. 2) and additional control circuitry within the additional control circuitry regions of the control circuitry structure 600. By way of non-limiting example, digit line routing and contact structures 620 within an individual digit line contact section 604 may be coupled with digit lines 214 (FIG. 2) within an individual array region 202 (FIG. 2) of the memory array structure 200 (FIG. 2) as well as SA devices within an individual SA section 610 horizontally neighboring the digit line contact section 604 in the Y-direction; LIO lines may horizontally extend, in the X-direction, from the SA devices to an individual first MG section 626 (which may have a mixed metal layout), and may be operatively associated with at least RW driver devices by way of the first MG section 626.

Thus, in accordance with embodiments of the disclosure, a microelectronic device includes a memory array structure and control circuitry structure vertically overlying and bonded to the memory array structure. The memory array structure includes memory cells, digit lines, and word lines. The control circuitry structure includes a control circuitry region, digit line contact sections, and word line contact sections. The control circuitry region includes sense amplifier sections and sub-word line driver sections. The sense amplifier sections are proximate first diagonally opposing corners of the control circuitry region and include sense amplifiers. The sub-word line driver sections are proximate second diagonally opposing corners of the control circuitry region and include sub-word line drivers. The digit line contact sections are horizontally adjacent to the sense amplifier sections in a first direction and include contact structures coupled to the sense amplifiers and the digit lines of the memory array structure. The word line contact sections are horizontally adjacent to the sub-word line driver sections in a second direction orthogonal to the first direction and include additional contact structures coupled to the sub-word line drivers and the word lines of the memory array structure.

Furthermore, in accordance with embodiments of the disclosure, a microelectronic device includes a memory array structure and a control circuitry structure vertically overlying and bonded to the memory array structure. The memory array structure includes array regions, digit line exit regions, and word line exit regions. The array regions include memory cells, digit lines, and word lines. The digit line exit regions alternate with the array regions in a first direction and include horizontal ends of the digit lines within horizontal areas thereof. The word line exit regions alternate with the array regions in a second direction and include horizontal ends of the word lines within horizontal areas thereof. The control circuitry structure includes control circuitry regions, digit line contact sections, word line contact sections, sense amplifier sections, and sub-word line driver sections. The control circuitry regions horizontally overlap the array regions of the memory array structure. The digit line contact sections horizontally overlap the digit line exit regions of the memory array structure. The word line contact sections horizontally overlap the word line exit regions of the memory array structure. The sense amplifier sections respectively horizontally overlap two of the control circuitry regions neighboring one another in the first direction. The sub-word line driver sections respectively horizontally overlap two other of the control circuitry regions neighboring one another in the second direction.

Moreover, in accordance with embodiments of the disclosure, a microelectronic device includes a memory array structure and a control circuitry structure vertically overlying and bonded to the memory array structure. The memory array structure includes array regions respectively comprising memory cells, digit lines, and word lines within horizontal areas thereof. The control circuitry structure includes control circuitry regions, sense amplifier sections including sense amplifier circuitry, and sub-word line driver sections including sub-word line driver circuitry. The control circuitry regions horizontally overlap the array regions of the memory array structure. The sense amplifier sections respectively horizontally overlap a corner portion of each of four of the control circuitry regions horizontally neighboring one another in a first direction and in a second direction orthogonal to the first direction. The sub-word line driver sections are horizontally offset from sense amplifier sections and respectively horizontally overlap a corner portion of each of an additional four of the control circuitry regions horizontally neighboring one another in the first direction and in the second direction.

Figure 7:
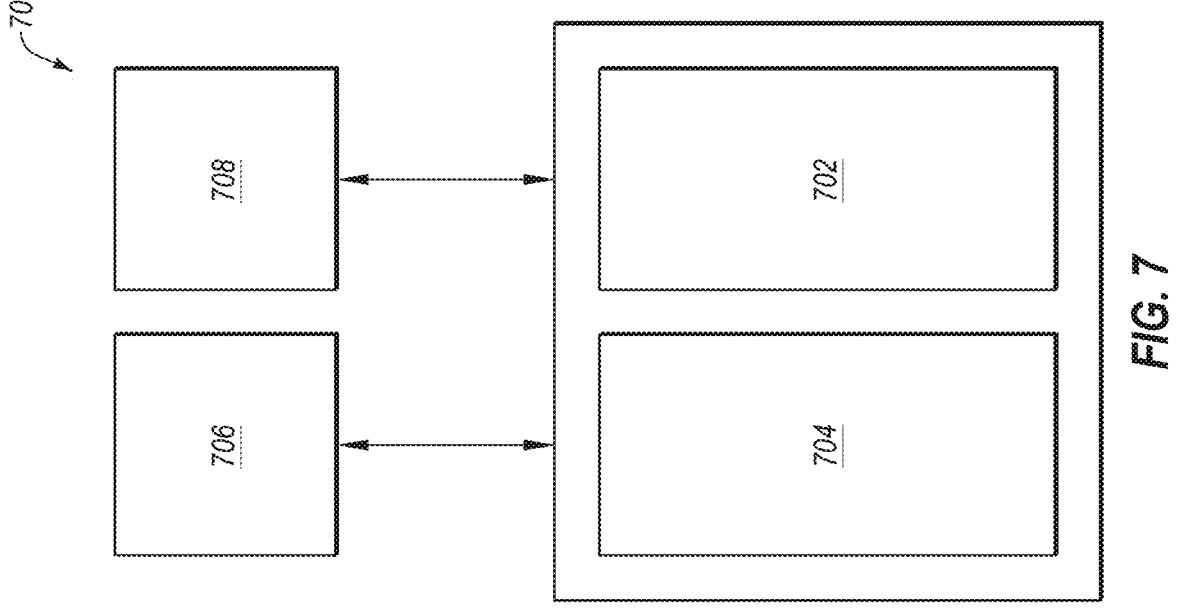
FIG. 7 is a simplified, schematic block diagram of an electronic system, in accordance with some embodiments of the disclosure.

Microelectronic devices (e.g., the microelectronic device 100) in accordance with embodiments of the disclosure may be used in embodiments of electronic systems of the disclosure. For example, FIG. 7 is a simplified, schematic block diagram illustrating an electronic system 700 according to embodiments of disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 700 includes at least one memory device 702. The memory device 702 may comprise, for example, a microelectronic device (e.g., the microelectronic device 100) previously described herein. The electronic system 700 may further include at least one electronic signal processor device 704 (often referred to as a "microprocessor"). The electronic signal processor device 704 may, optionally, comprise a microelectronic device (e.g., the microelectronic device 100) previously described herein. While the memory device 702 and the electronic signal processor device 704 are depicted as two (2) separate devices in FIG. 7, in additional embodiments, a single (e.g., only one) memory/processor device having the functionalities of the memory device 702 and the electronic signal processor device 704 is included in the electronic system 700. In such embodiments, the memory/processor device may include a microelectronic device (e.g., the microelectronic device 100) previously described herein. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, a monitor, a display, a printer, an audio output jack, a speaker, etc. In some embodiments, the input device 706 and the output device 708 comprise a single touchscreen device that can be used both to input information to the electronic system 700 and to output visual information to a user. The input device 706 and the output device 708 may communicate electrically with one or more of the memory device 702 and the electronic signal processor device 704.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
a memory array structure comprising memory cells, digit lines, and word lines; and
a control circuitry structure vertically overlying and bonded to the memory array structure, the control circuitry structure comprising:
a control circuitry region comprising:
sense amplifier sections proximate first diagonally opposing corners of the control circuitry region and comprising sense amplifiers;
sub-word line driver sections proximate second diagonally opposing corners of the control circuitry region and comprising sub-word line drivers;
column decoder sections horizontally neighboring the sense amplifier sections in a first direction and comprising column decoder devices;
mini-gap sections horizontally neighboring the column decoder sections in the first direction and comprising conductive routing structures coupled to the sense amplifiers and additional circuitry of the control circuitry structure; and
main word line driver sections horizontally neighboring the sub-word line driver sections in a second direction and comprising main word line drivers;
digit line contact sections horizontally adjacent to the sense amplifier sections in a first direction and comprising contact structures coupled to the sense amplifiers and the digit lines of the memory array structure; and
word line contact sections horizontally adjacent to the sub-word line driver sections in a second direction orthogonal to the first direction and comprising additional contact structures coupled to the sub-word line drivers and the word lines of the memory array structure.

2. The microelectronic device of claim 1, wherein the column decoder sections are horizontally interposed between the sense amplifier sections and the mini-gap sections in the first direction.

3. The microelectronic device of claim 1, wherein the main word line driver sections are horizontally interposed between the sub-word line driver sections and the sense amplifier sections in the second direction.

4. The microelectronic device of claim 1, wherein the memory array structure further comprises:
an array region comprising the memory cells, the array region at least partially horizontally overlapping the control circuitry region of the control circuitry structure;
digit line exit regions horizontally adjacent to the array region in the first direction, the digit lines coupled to the memory cells of the array region and terminating within the digit line exit regions; and
word line exit regions horizontally adjacent to the array region in the second direction, the word lines coupled to the memory cells of the array region and terminating within the digit line exit regions.

5. The microelectronic device of claim 4, wherein the digit line exit regions of the memory array structure are horizontally offset, in the first direction, from the digit line contact sections of the control circuitry structure.

6. The microelectronic device of claim 4, wherein the word line exit regions of the memory array structure are horizontally offset, in the second direction, from the word line contact sections of the control circuitry structure.

7. The microelectronic device of claim 1, wherein the digit line contact sections and the word line contact sections respectively at least partially overlap a horizontal area of the control circuitry region.

8. The microelectronic device of claim 7, wherein the digit line contact sections and the word line contact sections are respectively substantially confined within the horizontal area of the control circuitry region.

9. The microelectronic device of claim 1, wherein the digit line contact sections comprise:
a first digit line contact section horizontally adjacent to a first side of a first of the sense amplifier sections;
a second digit line contact section horizontally adjacent to a second, opposing side of the first of the sense amplifier sections;
a third digit line contact section horizontally adjacent to a first side of a second of the sense amplifier sections; and
a fourth digit line contact section horizontally adjacent to a second, opposing side of the second of the sense amplifier sections.

10. A microelectronic device, comprising:
a memory array structure comprising:
array regions comprising memory cells, digit lines, and word lines;
digit line exit regions alternating with the array regions in a first direction and comprising horizontal ends of the digit lines within horizontal areas thereof; and
word line exit regions alternating with the array regions in a second direction and comprising horizontal ends of the word lines within horizontal areas thereof;
a control circuitry structure vertically overlying and bonded to the memory array structure, the control circuitry structure comprising:
control circuitry regions horizontally overlapping the array regions of the memory array structure;
digit line contact sections horizontally overlapping the digit line exit regions of the memory array structure;

word line contact sections horizontally overlapping the word line exit regions of the memory array structure;

sense amplifier sections respectively horizontally overlapping two of the control circuitry regions neighboring one another in the first direction;

column decoder sections horizontally neighboring the sense amplifier sections in the first direction and comprising column decoder devices;

sub-word line driver sections respectively horizontally overlapping two other of the control circuitry regions neighboring one another in the second direction; and main word line driver sections horizontally neighboring the sub-word line driver sections in the second direction and comprising main word line driver devices.

11. The microelectronic device of claim 10, wherein:

the digit lines of the memory array structure comprise:

odd digit lines; and even digit lines alternating with the odd digit lines in the second direction; and the sense amplifier sections of the control circuitry structure respectively comprise:

odd sense amplifier devices coupled to the odd digit lines and within a horizontal area of a first of the two of the control circuitry regions; and even sense amplifier devices coupled to the even digit lines and within a horizontal area of a second of the two of the control circuitry regions.

12. The microelectronic device of claim 10, wherein:

the word lines of the memory array structure comprise:

odd word lines; and even word lines alternating with the odd word lines in the first direction; and the sub-word line driver sections of the control circuitry structure respectively comprise:

odd sub-word line driver devices coupled to the odd word lines and within a horizontal area of a first of the two other of the control circuitry regions; and even sub-word line driver devices coupled to the even word lines and within a horizontal area of a second of the two other of the control circuitry regions.

13. The microelectronic device of claim 12, wherein:

the sub-word line driver sections respectively horizontally overlap one of the word line contact sections interposed between the two other of the control circuitry regions; and the one of the word line contact sections comprises:

odd word line routing structures extending between and coupled to the odd word lines and the odd sub-word line driver devices; and even word line routing structures extending between and coupled to the even word lines and the even sub-word line driver devices.

14. A microelectronic device, comprising:

a memory array structure comprising:

array regions comprising memory cells, digit lines, and word lines;

digit line exit regions alternating with the array regions in a first direction and comprising horizontal ends of the digit lines within horizontal areas, the digit lines comprising:

odd digit lines; and even digit lines alternating with the odd digit lines in a second direction; and word line exit regions alternating with the array regions in a second direction and comprising horizontal ends of the word lines within horizontal areas thereof;

a control circuitry structure vertically overlying and bonded to the memory array structure, the control circuitry structure comprising:

control circuitry regions horizontally overlapping the array regions of the memory array structure;

digit line contact sections horizontally overlapping the digit line exit regions of the memory array structure;

word line contact sections horizontally overlapping the word line exit regions of the memory array structure;

sense amplifier sections respectively horizontally overlapping two of the control circuitry regions neighboring one another in the first direction and one of the digit line contact sections interposed between the two of the control circuitry regions, the sense amplifier sections respectively comprising:

odd sense amplifier devices coupled to the odd digit lines and within a horizontal area of a first of the two of the control circuitry regions; and even sense amplifier devices coupled to the even digit lines and within a horizontal area of a second of the two of the control circuitry regions;

wherein the one of the digit line contact sections comprises:

odd digit line routing structures extending between and coupled to the odd digit lines and the odd sense amplifier devices; and even digit line routing structures extending between and coupled to the even digit lines and the even sense amplifier devices; and sub-word line driver sections respectively horizontally overlapping two other of the control circuitry regions neighboring one another in the second direction.

15. A microelectronic device, comprising:

a memory array structure comprising array regions respectively comprising memory cells, digit lines, and word lines within horizontal areas thereof; and a control circuitry structure vertically overlying and bonded to the memory array structure, the control circuitry structure comprising:

control circuitry regions horizontally overlapping the array regions of the memory array structure;

sense amplifier sections comprising sense amplifier circuitry, the sense amplifier sections respectively horizontally overlapping a corner portion of each of four of the control circuitry regions horizontally neighboring one another in a first direction and in a second direction orthogonal to the first direction;

sub-word line driver sections comprising sub-word line driver circuitry, the sub-word line driver sections horizontally offset from sense amplifier sections and respectively horizontally overlapping a corner portion of each of an additional four of the control circuitry regions horizontally neighboring one another in the first direction and in the second direction;

first mini-gap sections within horizontal areas of the control circuitry regions and respectively horizontally adjacent one of the sense amplifier sections in the first direction, the first mini-gap sections comprising conductive routing structures operatively associated with sense amplifier circuitry of the sense amplifier sections; and second mini-gap sections within horizontal areas of the control circuitry regions and respectively horizontally adjacent one of the sub-word line driver sections in the second direction, the second mini-gap sections comprising additional conductive routing structures operatively associated with sub-word line driver circuitry of the sub-word line driver sections.

16. A microelectronic device, comprising:

a memory array structure including array regions respectively comprising, within a horizontal area thereof:
   memory cells;
   digit lines comprising even digit lines and odd digit lines horizontally alternating with the even digit lines in a second direction orthogonal to a first direction; and
   word lines; and a control circuitry structure vertically overlying and bonded to the memory array structure, the control circuitry structure comprising:
   control circuitry regions horizontally overlapping the array regions of the memory array structure;
   sense amplifier sections comprising sense amplifier circuitry, the sense amplifier sections respectively horizontally overlapping a corner portion of each of four of the control circuitry regions horizontally neighboring one another in the first direction and in the second direction, wherein:
      some of the sense amplifier sections comprise even sense amplifier sections comprising even sense amplifier devices coupled to the even digit lines; and
      some other of the sense amplifier sections substantially aligned with the some of the sense amplifier sections in the second direction comprise odd sense amplifier sections comprising odd sense amplifier devices coupled to the odd digit lines; and
   sub-word line driver sections comprising sub-word line driver circuitry, the sub-word line driver sections horizontally offset from sense amplifier sections and respectively horizontally overlapping a corner portion of each of an additional four of the control circuitry regions horizontally neighboring one another in the first direction and in the second direction.

17. The microelectronic device of claim 16, wherein:

the word lines comprise even word lines and odd word lines horizontally alternating with the even word lines in the first direction;

some of the sub-word line driver sections comprise even sub-word line driver sections comprising even sub-word line driver devices coupled to the even word lines; and some other of the sub-word line driver sections substantially aligned with the some of the sub-word line driver sections in the first direction comprise odd sub-word line driver sections comprising odd sub-word line driver devices coupled to the odd word lines.

* * * * *